(12) United States Patent
Koshiyama et al.

(10) Patent No.: US 8,438,457 B2
(45) Date of Patent: May 7, 2013

(54) NONVOLATILE MEMORY APPARATUS, MEMORY CONTROLLER, AND MEMORY SYSTEM

(75) Inventors: Junichi Koshiyama, Tokyo (JP); Kenichi Nakanishi, Tokyo (JP); Keiichi Tsutsui, Tokyo (JP)

(73) Assignee: Sony Corporation, Tokyo (JP)

( * ) Notice: Subject to any disclaimer, the term of this patent is extended or adjusted under 35 U.S.C. 154(b) by 329 days.

(21) Appl. No.: 12/874,914

(22) Filed: Sep. 2, 2010

(65) Prior Publication Data

US 2011/0066923 A1    Mar. 17, 2011

(30) Foreign Application Priority Data

Sep. 11, 2009  (JP) ................................ P2009-210433
Jul. 30, 2010  (JP) ................................ P2010-171690

(51) Int. Cl.
*G11C 29/00*    (2006.01)
(52) U.S. Cl.
USPC ....... 714/773; 714/763; 711/103; 365/185.09
(58) Field of Classification Search .................. 714/763, 714/773; 711/103; 365/185.09
See application file for complete search history.

(56) References Cited

U.S. PATENT DOCUMENTS

| 2006/0256615 | A1 | 11/2006 | Larson |
| 2008/0126905 | A1 | 5/2008 | Deguchi et al. |
| 2011/0041037 | A1* | 2/2011 | Frost et al. .................... 714/763 |
| 2011/0213919 | A1* | 9/2011 | Frost et al. .................... 711/103 |
| 2012/0155174 | A1* | 6/2012 | Cornwell et al. ........ 365/185.09 |

FOREIGN PATENT DOCUMENTS

| JP | 8-166910 | 6/1996 |
| JP | 9-167120 | 6/1997 |
| JP | 2001-117825 | 4/2001 |
| JP | 2004-348824 | 12/2004 |
| JP | 2006-318461 | 11/2006 |
| JP | 2008-139908 | 6/2008 |
| JP | 2008-192054 | 8/2008 |

OTHER PUBLICATIONS

U.S. Appl. No. 12/816,685, filed Jun. 16, 2010, Nakanishi, et al.

* cited by examiner

*Primary Examiner* — Sam Rizk
(74) *Attorney, Agent, or Firm* — Oblon, Spivak, McClelland, Maier & Neustadt, L.L.P.

(57) ABSTRACT

Disclosed herein is a nonvolatile memory apparatus including, a nonvolatile memory section, a standard error correction code processing section, an extended error correction code processing section, and a control section.

19 Claims, 22 Drawing Sheets

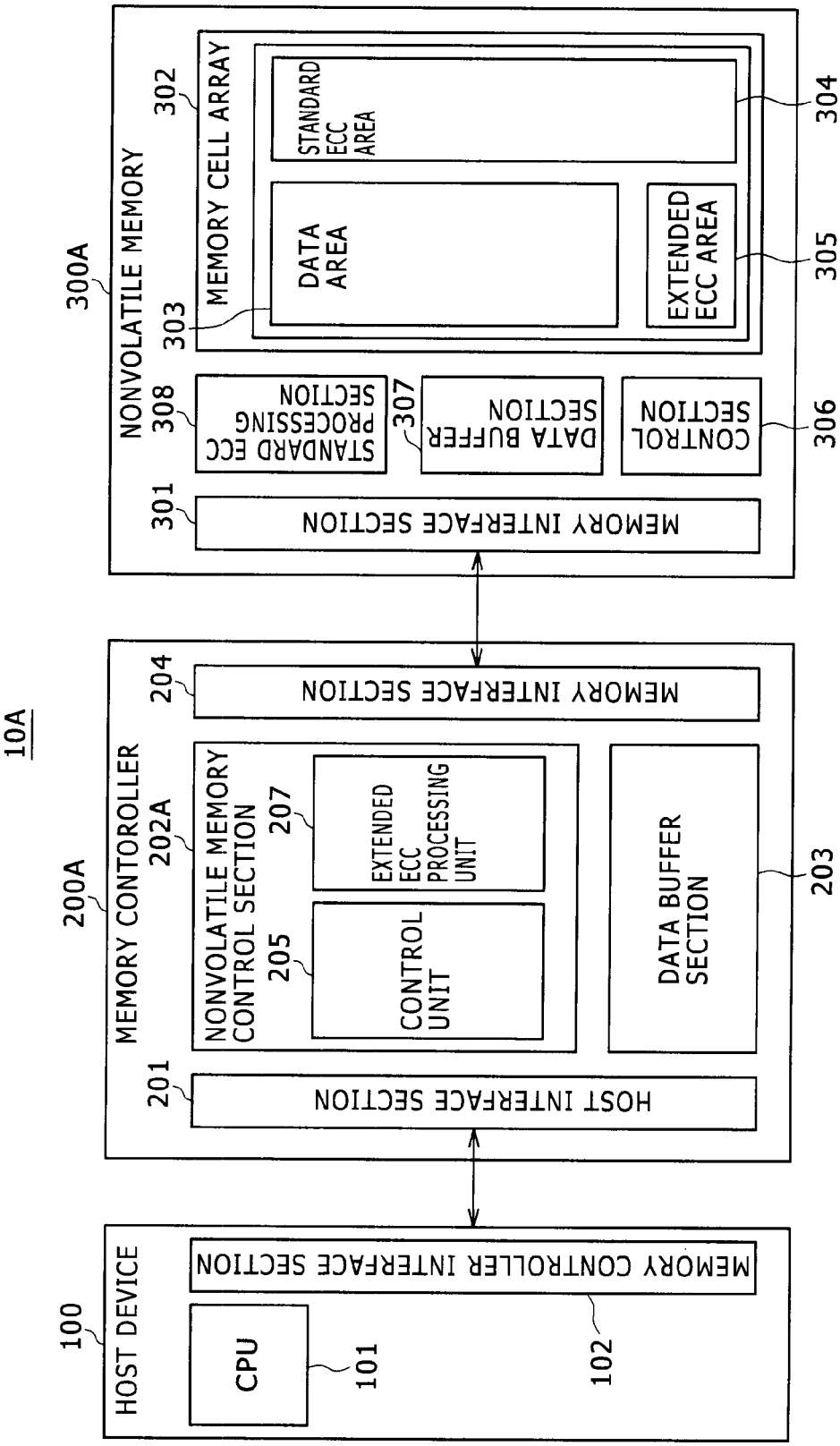

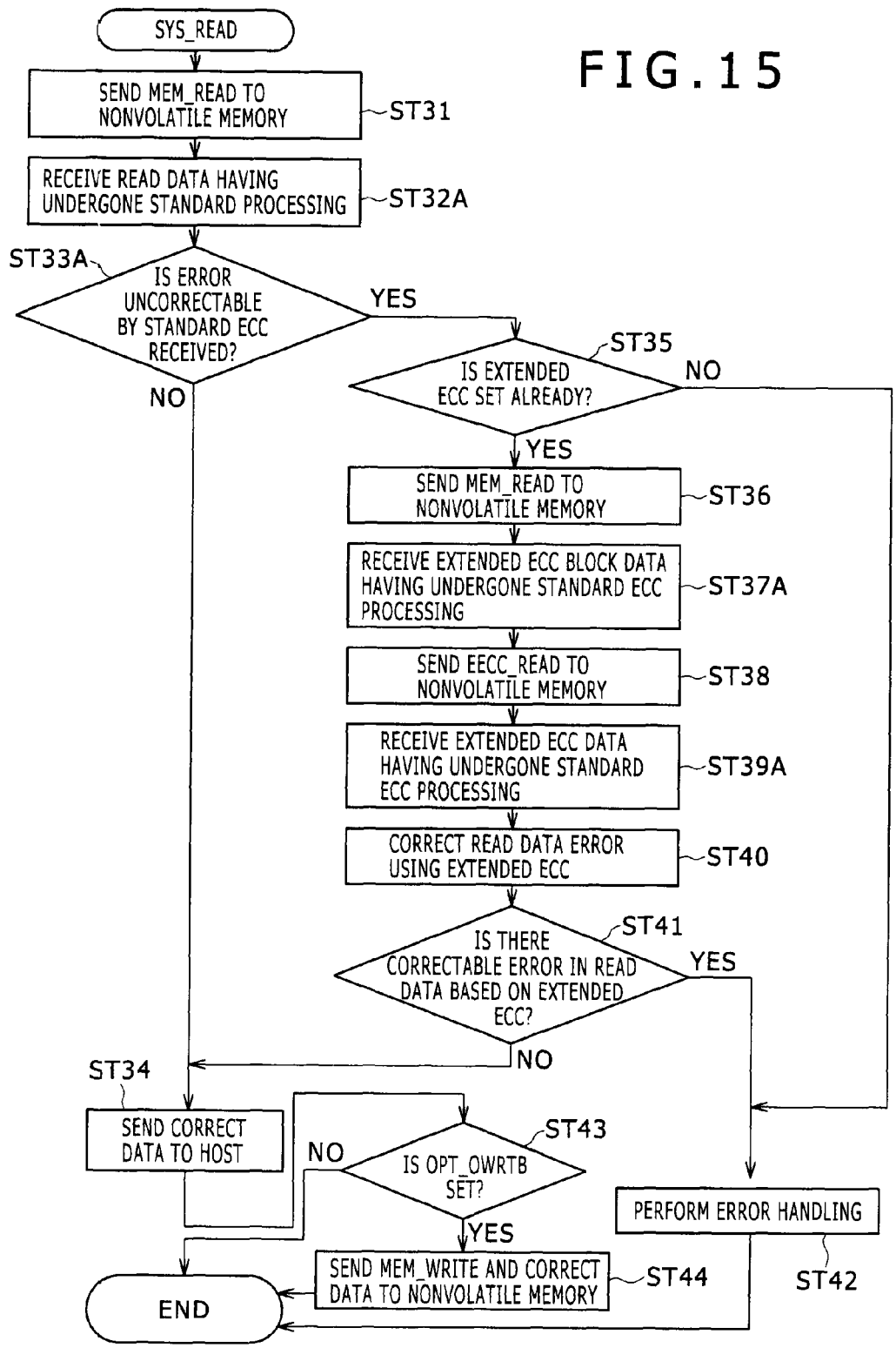

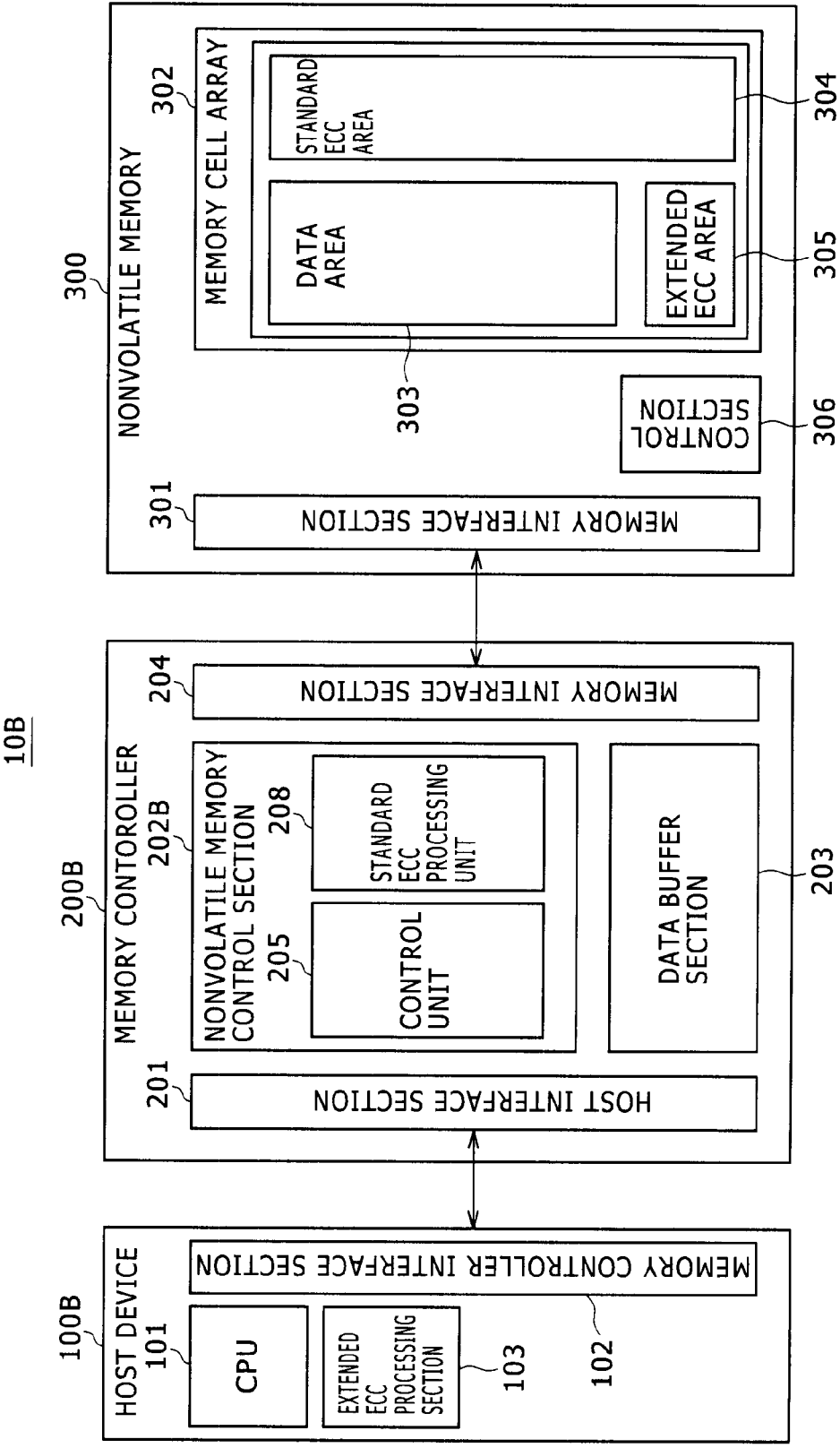

NONVOLATILE MEMORY APPARATUS, MEMORY CONTROLLER, AND MEMORY SYSTEM

BACKGROUND OF THE INVENTION

1. Field of the Invention

The present invention relates to a nonvolatile memory apparatus, a memory controller, and a memory system having an error correction function each.

2. Description of the Related Art

The nonvolatile memory is a memory which may be accessed in units of data called a page made up of a plurality of bytes or words and which retains data therein after power is removed. Thanks to these features, the nonvolatile memory is used extensively in storage systems accessed in units of a sector. The NAND flash memory is a representative nonvolatile memory (NVM).

In recent years, development and commercialization have been made progress in nonvolatile random access memories (NVRAM's) which are randomly accessible in units of a byte or a word as with the SRAM, DRAM, and other volatile random access memories (RAM's) but which can retain data even after power is turned off. The FeRAM (ferroelectric random access memory), PCRAM (phase change random access memory), and ReRAM (resistance random access memory) are typical NVRAM's.

The NVM uses an error correction code (ECC) to improve data reliability. A high-speed ECC scheme is needed to minimize adverse effects on access speed. One such ECC scheme is an extended Hamming code capable of one-bit error correction and two-bit error detection.

The NVRAM is required to provide random access performance as rapid as that of DRAM's in units of a byte or a word. For this reason, the ECC for the NVRAM needs to constitute a system that permits very rapid error correction in units of a small access unit.

Meanwhile, the higher the ability to correct errors, the longer it takes the ECC scheme to handle error detection and correction and the larger the code size involved. To preserve ECCs along with data in the NVM or NVRAM requires setting aside a redundant bit area in addition to data retention areas in the memory. To use an ECC scheme with a higher error correction capability thus entails appropriating the redundant bit area of a larger capacity than before.

Japanese Patent Laid-open No. 2008-192054 discloses a memory system furnished with an error correction function.

The semiconductor memory system disclosed in the cited patent application utilizes a first error correction code as well as a second error correction code that has a higher correction capability than the first error correction code. If an error correctable by the first error correction code is detected from read data, any error that may occur thereafter is corrected using the second error correction code in order to enhance data reliability.

SUMMARY OF THE INVENTION

However, where the error correction system offers a higher-performing error detection and correction capability, the code size involved becomes correspondingly larger, and it takes longer to carry out error detection and correction processes. This leads to a decline in access performance.

In order to maintain the existing access performance, the error correction capability as is may be improved comparatively by reducing the unit size of the data to be protected. However, this involves enlarging the capacity of the redundant bit area relative to the data area. Given that its storage capacity remains the same, the nonvolatile memory apparatus will then have a smaller area to actually accommodate data.

In the meantime, the longer the data stored the nonvolatile memory is retained therein, the greater the degree of memory deterioration leading to increasing bit corruption. Although the tendency to deteriorate varies depending on the storage method of the nonvolatile memory in question, the NAND flash memory illustratively tends to deteriorate further in data retention characteristics the larger the number of times the data of its memory cells are rewritten. Another big factor causing the NAND flash memory to worsen in data retention characteristics is that because memory cells store electrical charges for data storage, the ongoing miniaturization of production processes tends to reduce the charge to be accumulated per memory cell.

According to the technique disclosed in the above-cited patent document, bit corruption is detected from frequently retrieved data at early stages using the first error correction code, and data errors are prevented using the correction capability reinforced by the second error correction code. However, the detection of bit corruption tends to be delayed in the case of data not accessed for a long time. Due to the resulting advance in bit corruption, the data having developed errors uncorrectable by the first error correction code before switchover to the second error correction code cannot be retrieved as correct data thereafter. Furthermore, since error correction is performed on the data of the same unit size using the second error correction code as in the case of the first error correction code, the capacity of the redundant bit area necessary for retaining error correction codes is liable to increase.

According to an embodiment of the present invention there is provided a nonvolatile memory apparatus including:

a nonvolatile memory section configured to include a data area for storing data, a standard ECC area for storing standard ECCs, and an extended ECC area for storing extended ECCs;

a standard ECC processing section configured to generate a standard ECC thereby to perform an error correction process on the data in the data area per access unit;

an extended ECC processing section configured to generate an extended ECC thereby to perform an error correction process on the data in the data area per integral multiple of the access unit; and a control section configured to control access to the nonvolatile memory section as well as the processes of the standard ECC processing section and the extended ECC processing section, wherein the control section includes, a standard ECC area write function configured such that upon receipt of a write instruction, the standard ECC area write function causes the standard ECC processing section to generate a standard ECC per access unit from received data, write the data to the data area of the nonvolatile memory section, and write the generated standard ECCs to the standard ECC area, a read function configured such that upon receipt of a read instruction, the read function reads data from the data area of the nonvolatile memory section, reads the standard ECCs from the standard ECC area, causes the standard ECC processing section to perform error detection and correction of the read data per access unit, and sends the corrected data to the outside, an extended ECC area write function configured such that upon receipt of an external instruction, the extended ECC area write function reads data composed of an integer multiple of the access unit starting from the instruction-designated address in the data area of the nonvolatile memory section, and causes the extended ECC processing section to generate an extended ECC so as to write the generated extended ECC to the extended ECC area, and a function configured such that upon receipt of an external instruction, the function reads data composed of an integer multiple of the access unit starting from the instruction-designated address in the data area of the nonvolatile memory section, reads the extended ECC from the extended ECC area, causes the extended ECC processing section to perform error detection and correction of the read data, and sends the corrected data to the outside.

According to another embodiment of the present invention there is provided a memory controller including:

a control section configured to control access to a nonvolatile memory section including a data area for storing data, a standard ECC area for storing standard ECCs, and an extended ECC area for storing extended ECCs;

a standard ECC processing section configured to generate a standard ECC thereby to perform an error correction process on the data in the data area per access unit; and an extended ECC processing section configured to generate an extended ECC thereby to perform an error correction process on the data in the data area per integral multiple of the access unit, wherein the control section includes, a standard ECC area write function configured such that upon receipt of a write instruction, the standard ECC area write function causes the standard ECC processing section to generate a standard ECC per access unit from received data, write the data to the data area of the nonvolatile memory section, and write the generated standard ECCs to the standard ECC area, a function configured such that upon receipt of a read instruction, the function reads data from the data area of the nonvolatile memory section, reads the standard ECCs from the standard ECC area, causes the standard ECC processing section to perform error detection and correction of the read data per access unit, and sends the corrected data to the outside, an extended ECC area write function configured such that upon receipt of an external instruction, the extended ECC area write function reads data composed of an integer multiple of the access unit starting from the instruction-designated address in the data area of the nonvolatile memory section, and causes the extended ECC processing section to generate an extended ECC so as to write the generated extended ECC to the extended ECC area, and a function configured such that upon receipt of an external instruction, the function reads data composed of an integer multiple of the access unit starting from the instruction-designated address in the data area of the nonvolatile memory section, reads the extended ECC from the extended ECC area, causes the extended ECC processing section to perform error detection and correction of the read data, and sends the corrected data to the outside.

According to yet another embodiment of the present invention there is provided a memory controller including:

a control section configured to control access to a nonvolatile memory section including a data area for storing data, a standard ECC area for storing standard ECCs, an extended ECC area for storing extended ECCs, and a standard ECC processing section for generating a standard ECC thereby to perform an error correction process on the data in the data area per access unit; and an extended ECC processing section configured to generate an extended ECC thereby to perform an error correction process on the data in the data area per integral multiple of the access unit, wherein the control section includes, a data area write function configured such that upon receipt of a write instruction, the data area write function writes received data to the data area of the nonvolatile memory section, a function configured such that upon receipt of a read instruction, the function reads from the data area of the nonvolatile memory section the data corrected by the standard ECC and sends the read data to the outside, an extended ECC area write function configured such that upon receipt of an external instruction, the extended ECC area write function reads data composed of an integer multiple of the access unit starting from the instruction-designated address in the data area of the nonvolatile memory section, and causes the extended ECC processing section to generate an extended ECC so as to write the generated extended ECC to the extended ECC area, and a function configured such that upon receipt of an external instruction, the function reads data composed of an integer multiple of the access unit starting from the instruction-designated address in the data area of the nonvolatile memory section, reads the extended ECC from the extended ECC area, causes the extended ECC processing section to perform error detection and correction of the read data, and sends the corrected data to the outside.

Further, according to another embodiment of the present invention there is provided a memory system including:

a nonvolatile memory section configured to include a data area for storing data, a standard ECC area for storing standard ECCs, and an extended ECC area for storing extended ECCs;

a standard ECC processing section configured to generate a standard ECC thereby to perform an error correction process on the data in the data area per access unit;

an extended ECC processing section configured to generate an extended ECC thereby to perform an error correction process on the data per integral multiple of the access unit;

a memory controller configured to control access to the nonvolatile memory section as well as the processes of the standard ECC processing section and the extended ECC processing section; and a host device configured at least to issue a write and a read instruction to the memory controller, wherein the memory controller includes, a standard ECC area write function configured such that upon receipt of the write instruction from the host device, the standard ECC area write function causes the standard ECC processing section to generate a standard ECC per access unit from received data, write the data to the data area of the nonvolatile memory section, and write the generated standard ECCs to the standard ECC area, a read function configured such that upon receipt of the read instruction from the host device, the read function reads data from the data area of the nonvolatile memory section, reads the standard ECCs from the standard ECC area, causes the standard ECC processing section to perform error detection and correction of the read data per access unit, and sends the corrected data to the outside, an extended ECC area write function configured such that upon receipt of an instruction from the host device, the extended ECC area write function reads data composed of an integer multiple of the access unit starting from the instruction-designated address in the data area of the nonvolatile memory section, and causes the extended ECC processing section to generate an extended ECC so as to write the generated extended ECC to the extended ECC area, and a function configured such that upon receipt of an instruction from the host device, the function reads data composed of an integer multiple of the access unit starting from the instruction-designated address in the data area of the nonvolatile memory section, reads the extended ECC from the extended ECC area, causes the extended ECC processing section to perform error detection and correction of the read data, and sends the corrected data to the outside.

According to the present invention embodied as outlined above, the errors that cannot be corrected using the standard ECC are corrected using the extended ECC so as to enhance the ability of the embodiment to correct errors in the data stored for an extended period of time. Usually, the standard ECC is adopted to minimize any decline in the performance of accessing the NVM and NVRAM for read and write operations. The embodiment is equipped with means for designating data required for long-term retention, and applies an extended ECC to data composed of a plurality of data units in order to minimize the increase in the redundant bit area in which to store extended ECCs.

BRIEF DESCRIPTION OF THE DRAWINGS

FIG. 14 is a schematic view showing a configuration example of a memory system which constitutes a second embodiment of the present invention and which includes a nonvolatile memory apparatus according to the invention;

FIG. 15 is a flowchart explanatory of how a memory controller of the second embodiment operates upon receipt of the read command SYS_READ;

FIG. 16 is a schematic view showing a configuration example of a memory system which constitutes a third embodiment of the present invention and which includes a nonvolatile memory apparatus according to the invention;

DETAILED DESCRIPTION OF THE PREFERRED EMBODIMENTS

The preferred embodiments of the present invention will now be described in reference to the accompanying drawings under the following headings:

1. First embodiment (first configuration example of the memory system)
2. Second embodiment (second configuration example of the memory system)
3. Third embodiment (third configuration example of the memory system)
4. Fourth embodiment (fourth configuration example of the memory system)
5. Fifth embodiment (fifth configuration example of the memory system)
6. Sixth embodiment (sixth configuration example of the memory system)
7. Seventh embodiment (seventh configuration example of the memory system)

1. First Embodiment

Figure 1:
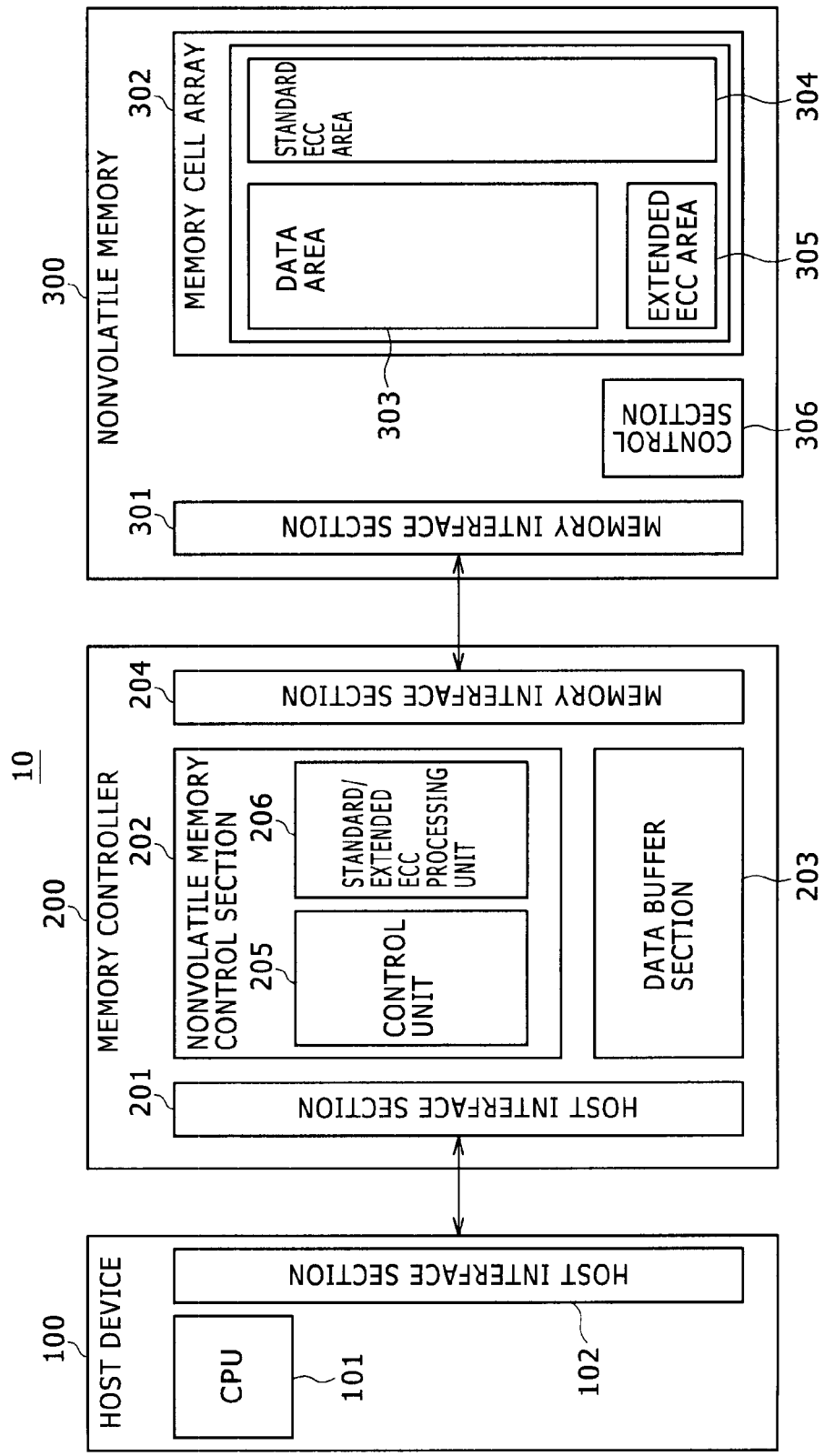
FIG. 1 is a schematic view showing a configuration example of a memory system which constitutes a first embodiment of the present invention and which includes a nonvolatile memory apparatus according to the invention.

FIG. 1 is a schematic view showing a configuration example of a memory system 10 which constitutes the first embodiment of the present invention and which includes a nonvolatile memory apparatus according to the invention.

As examples of the nonvolatile memory apparatus constituting part of the memory system 10 as the first embodiment, there are two memory types: the nonvolatile memory (NVM) such as the NAND flash memory that can be accessed only in units of a page made up of hundreds to thousands of bytes, and the nonvolatile random access memory (NVRAM) that can be accessed in units of a byte or a word. Explained below is an example involving a nonvolatile random access memory (NVRAM) that allows data to be rewritten thereto without being instructed to be cleared of its content.

The memory system 10 is made up of a host device 100, a memory controller 200, and a nonvolatile memory 300. The nonvolatile memory 300 constitutes the nonvolatile memory section as part of the embodiments described in the appended claims.

The memory system 10 as the first embodiment of the invention includes the function of adding a standard ECC to each data unit as small as a byte or a word in the NVRAM, and the function of setting an extended ECC per integer multiple of the access unit for the data selected by the host device 100. The memory system 10 also includes the function of correcting an error using the extended ECC if the error cannot be corrected upon data readout using the standard ECC. In the memory system 10 of the first embodiment, the memory controller 200 carries out standard and extended ECC processing.

The components of the host device 100, memory controller 200, and nonvolatile memory 300 are explained below.

The host device 100 is structured to include a CPU 101 and a host interface section 102.

The CPU 101 has the function of issuing various commands to the memory controller 200 as follows:

The CPU 101 issues a data write command SYS_WRITE and sends the issued command together with write data to the memory controller 200 through the host interface section 102. The data write command SYS_WRITE includes an option OPT_ESET providing an additional operation mode in which to designate the setting of an extended ECC to the data being written.

The CPU 101 also issues a data read command SYS_READ and sends the issued command to the memory controller 200 so as to receive read data therefrom through the host interface section 102. The received data has undergone error correction using the standard ECC. The data read command SYS_READ includes an option OPT_OWRTB providing an addition operation mode in which to designate a write-back of the ECC-corrected data.

The CPU 101 also issues an extended ECC set command EECC_SET for generating and storing an extended ECC and sends the issued command together with a starting address of the data in question to the memory controller 200 through the host interface section 102. If the data to which an extended ECC has been set develops an error that cannot be corrected using the standard ECC upon data readout, the error is corrected using the extended ECC.

The CPU 101 also issues an extended ECC read command EECC_GET and sends through the host interface section 102 the issued command together with a starting address of the data in question to the memory controller 200 so as to receive therefrom extended ECC information that has been set.

The CPU 101 further issues an extended ECC clear command EECC_CLR and sends through the host interface section 102 the issued command together with a starting address of the data to be cleared to the memory controller 200.

It should be noted that the starting address of the data of interest is used to designate an extended ECC block 230.

The memory controller 200 includes a host interface section 201, a nonvolatile memory control section 202, a data buffer section 203, and a memory interface section 204. The nonvolatile memory control section 202 is structured to include a control unit 205 and a standard/extended ECC processing unit 206. The standard/extended ECC processing unit 206 has the functions of both a standard ECC processing unit and an extended ECC processing unit.

The host interface section 201 receives commands from the host device 100 and notifies the nonvolatile memory control section 202 of the received commands.

The control unit 205 of the nonvolatile memory control section 202 decodes the commands received from the host device 100 and performs processing accordingly. In this case, the control unit 205 issues the commands described below to the nonvolatile memory 300 through the memory interface section 204.

The control unit 205 issues a write command MEM_WRITE and sends the issued command together with write command to the nonvolatile memory 300 through the memory interface section 204.

The control unit 205 also issues a read command MEM_READ and sends through the memory interface section 204 the issued command to the nonvolatile memory 300 so as to receive read data therefrom.

The control unit 205 also issues an extended ECC write command EECC_WRITE and sends to the nonvolatile memory 300 the issued command together with the write data to be written to an extended ECC area of the memory 300 through the memory interface section 204.

The control unit 205 also issues an extended ECC read command EECC_READ and sends through the memory interface section 204 the issued command to the nonvolatile memory 300 so as to receive the data read from the extended ECC area of the memory 300.

If the command SYS_READ received from the host device 100 is found to have the option OPT_OWRTB set for a write-back of corrected data, then the control unit 205 issues the command MEM_READ followed by the command MEM_WRITE or EECC_WRITE to write the data corrected using the standard or extended ECC back to the nonvolatile memory 300.

The data buffer section 203 temporarily stores the write data received from the host device 100 through the host interface section 201. The data buffer section 203 also stores temporarily the data read by the control unit 205 from the nonvolatile memory 300 through the memory interface section 204.

Figure 2:
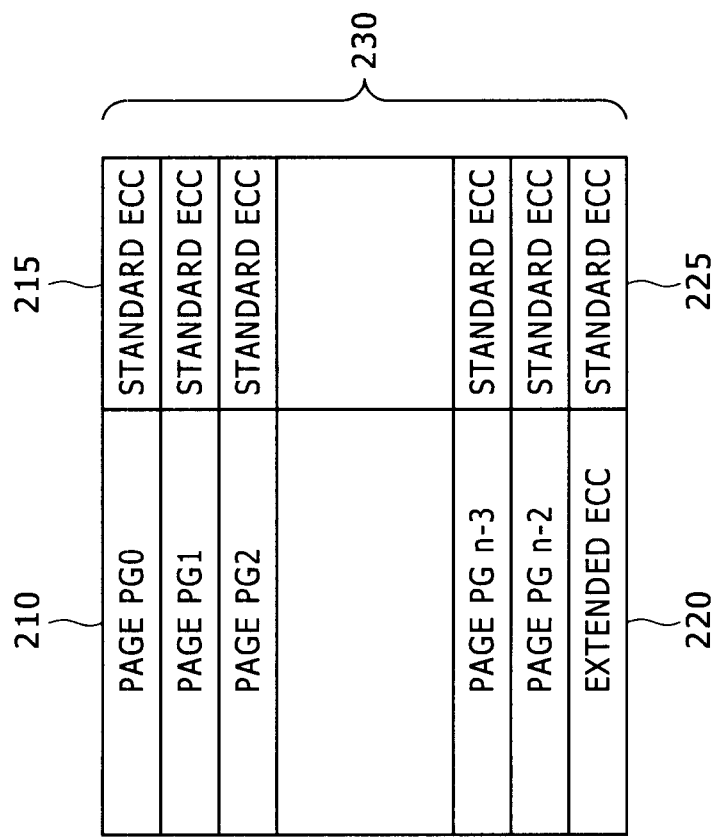
FIG. 2 is a schematic view explanatory of standard and extended ECCs for use with the first embodiment.

FIG. 2 is a schematic view explanatory of standard and extended ECCs for use with the first embodiment. The basic functions of the standard/extended ECC processing unit 206 are explained below in reference to FIG. 2. In FIG. 2, the unit of access from the system to the NVM is called a page. For the NVRAM, the page is composed of a single byte or word; for the NAND flash memory, the page coincides with a page constituting the unit in which to write. An access unit with a standard ECC is written to a page 210 with a standard ECC 215. An integer (n) multiple of the access unit is assumed to constitute an extended ECC block 230. The last page 220 of the extended ECC block 230 is an extended ECC area to which an extended ECC 220 and a standard ECC 225 for protecting the page are written. For example, in the case of the NAND flash memory, the extended ECC block 230 coincides with the block to be cleared.

The standard/extended ECC processing unit 206 generates a standard ECC per page data 210 of pages PG0 through PGn-2 and adds the generated standard ECC to each page as shown illustratively in FIG. 2. The data is output and written to the nonvolatile memory (NVM) 300 in units of a page.

When generating an extended ECC, the standard/extended ECC processing unit 206 reads from the nonvolatile memory 300 as many as (n−1) pages of page data 210, i.e., n pages minus the page 220 for the extended ECC of the extended ECC block 230.

The standard/extended ECC processing unit 206 subjects the read data to the standard ECC processing section for error detection and correction, before inputting the (n−1) pages of page data 210 minus standard ECCs to the extended ECC processing section to generate an extended ECC. The standard/extended ECC processing unit 206 again inputs the generated extended ECC to the standard ECC processing section to supplement it with standard ECC data, before outputting the extended ECC to the nonvolatile memory 300. What is written eventually to the nonvolatile memory 300 is the last page 220 of the extended ECC block 230 plus the standard ECC 225 for the page.

Furthermore, when standard and extended ECCs are to be generated simultaneously, the standard/extended ECC processing unit 206 first adds a standard ECC 215 to each of the pages making up the page data 210 for a total of (n−1; pages of write data, and outputs the data together with the added standard ECC 215 per page to the nonvolatile memory 300 for storage therein. Parallelly, the standard/extended ECC processing unit 206 generates an extended ECC 220 while the above-mentioned (n−1) pages of page data are being input. After writing the page data 210 of the page PGn−2 and the corresponding standard ECC 215 to the nonvolatile memory 300, the standard/extended ECC processing unit 206 adds standard ECC data 225 to the extended ECC 220 to make up one page of data. That one page of data is output to the nonvolatile memory 300 so that the data will be written thereto as the past page 220 of the extended ECC block 230.

The standard/extended ECC processing unit 206 carries out the generation of standard and extended ECCs as well as error correction and detection. Upon detecting an error, the standard/extended ECC processing unit 206 corrects the error in the data buffer section 203 and outputs the corrected data to the host device 100.

Figure 3:
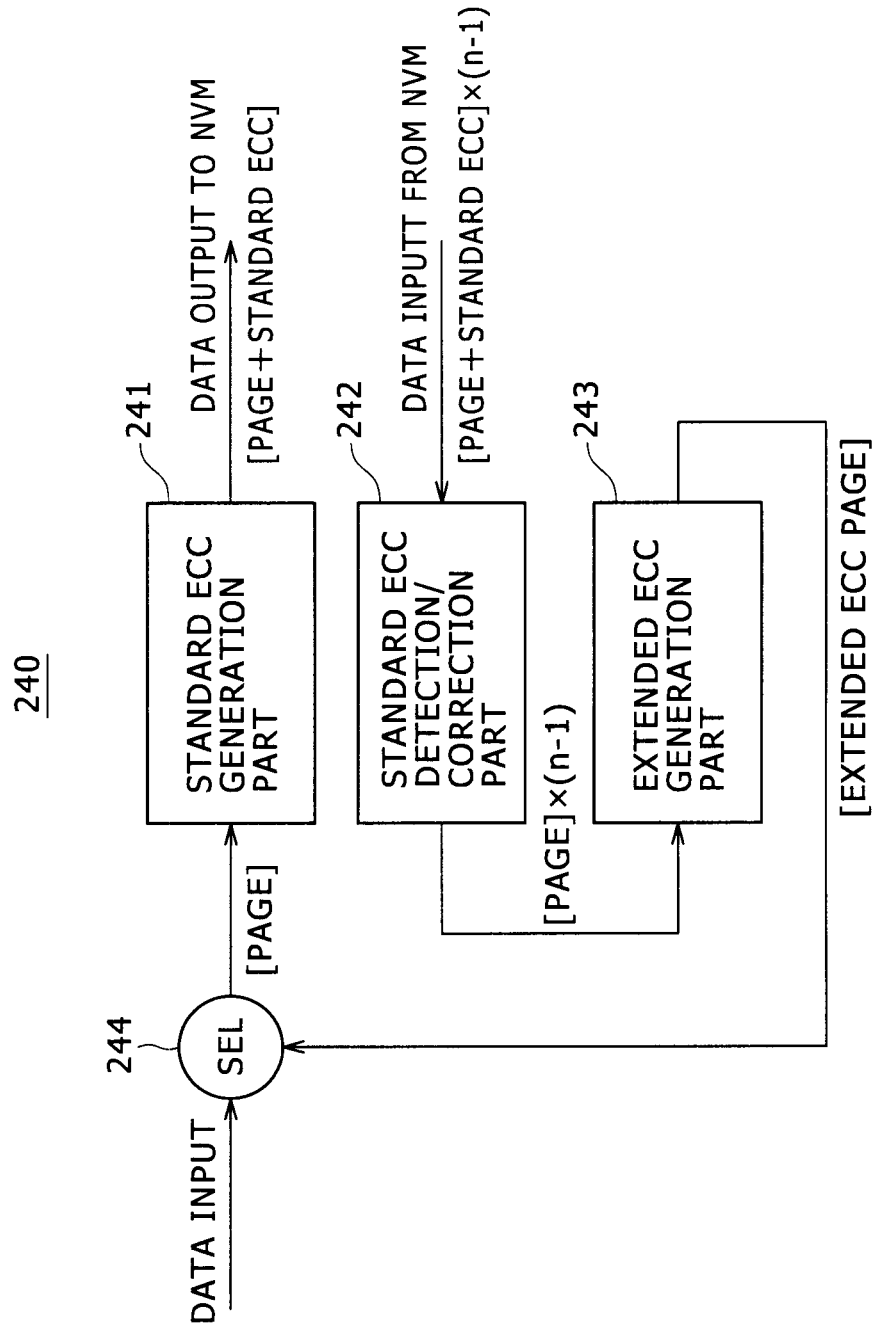
FIG. 3 is a schematic view showing a first composition example of a standard/extended ECC generation block as part of the first embodiment.
Figure 4:
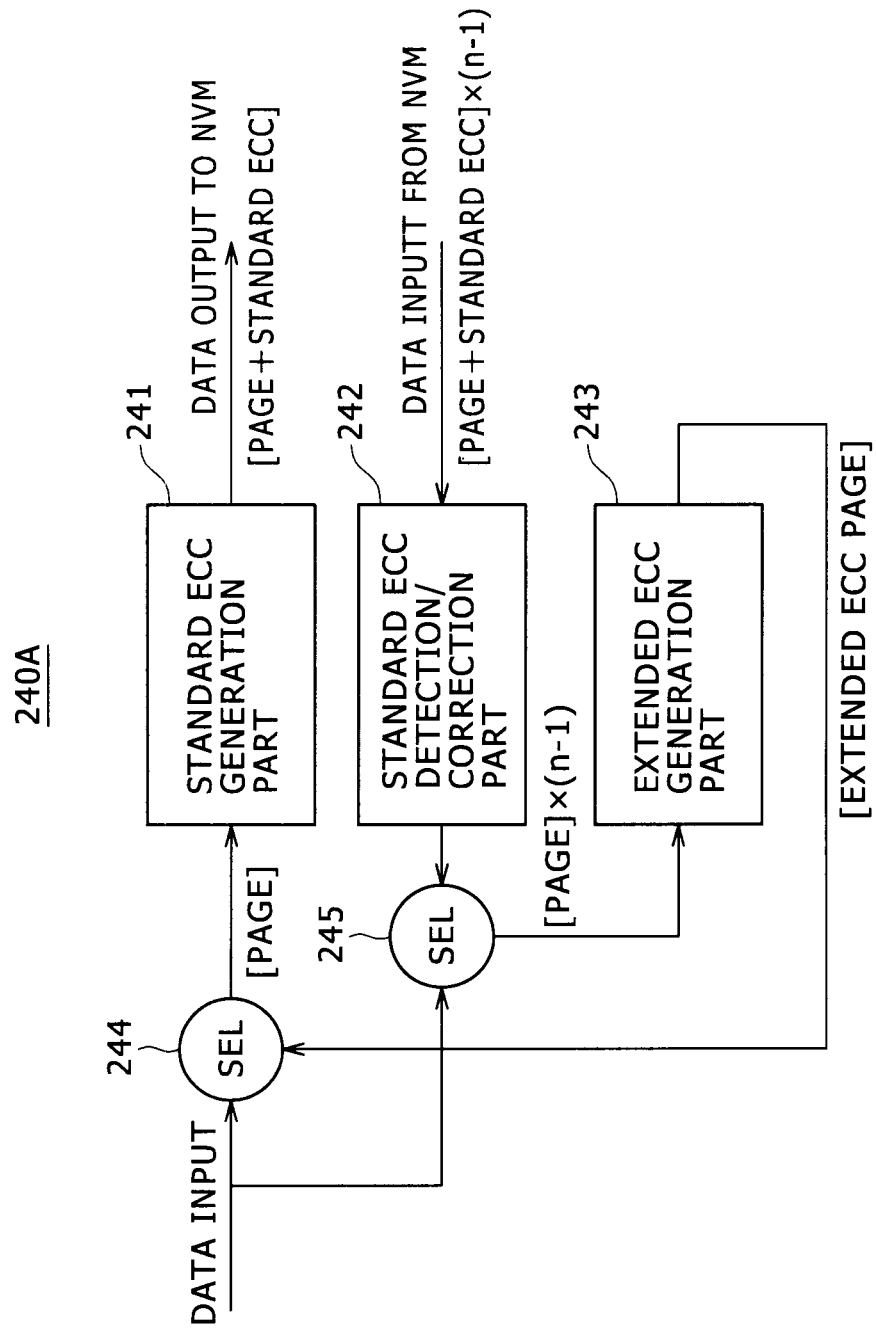
FIG. 4 is a schematic view showing a second composition example of the standard/extended ECC generation block as part of the first embodiment.
Figure 5:
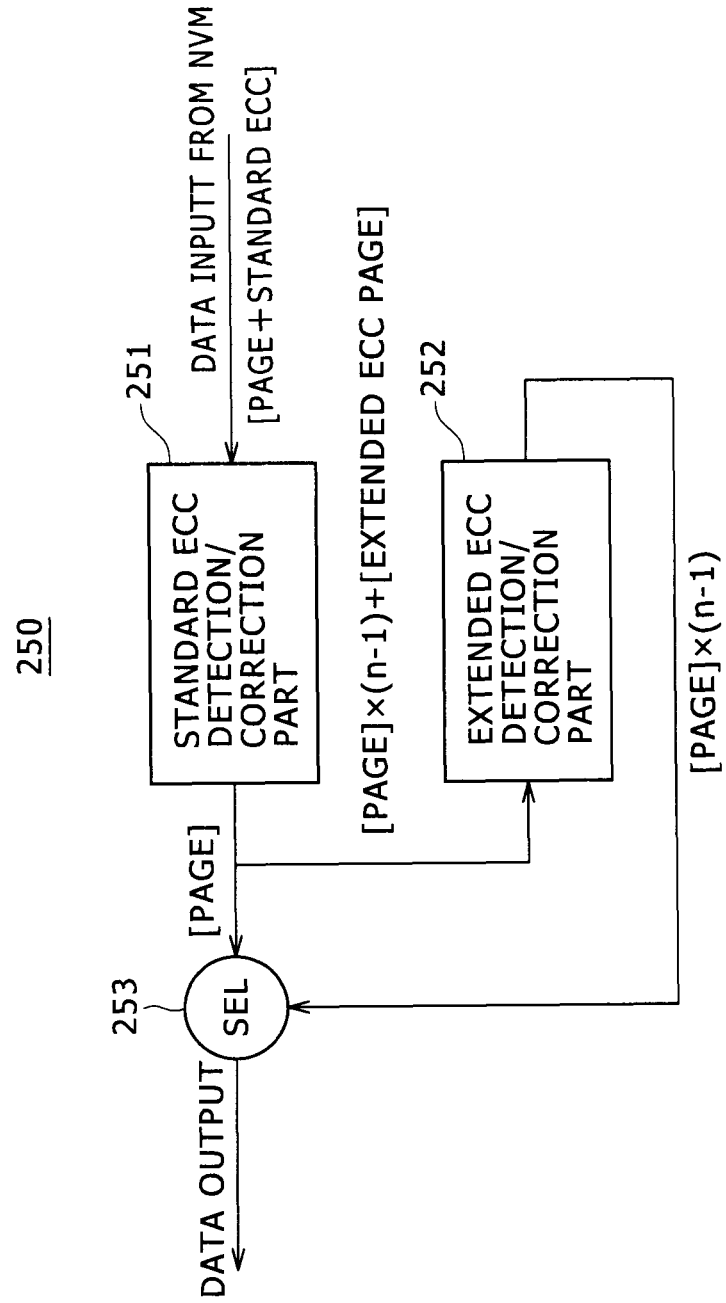
FIG. 5 is a schematic view showing a composition example of a standard/extended ECC detection/correction part as part of the first embodiment.

Explained below in reference to FIGS. 3 through 5 are composition examples of a standard/extended ECC generation block and a standard/extended ECC detection/correction part in the standard/extended ECC processing unit 206.

FIG. 3 is a schematic view showing the first composition example of a standard/extended ECC generation bloc 240 as part of the first embodiment. In FIG. 3, the standard/extended ECC generation bloc 240 includes a standard ECC generation part 241, a standard ECC detection/correction part 242, an extended ECC generation part 243, and a selector (SEL) 244.

In the standard/extended ECC generation bloc 240, write data is input to the standard ECC generation part 241 through the selector 244. With a standard ECC 215 added to the page data 210 to make up one page of data, the data is output and written to the nonvolatile memory (NVM) 300. If an extended ECC is set for the standard/extended ECC generation bloc 240, all page data 210 of the extended ECC block 230 along with their standard ECCs 215 are read from the nonvolatile memory (NVM) 300.

Following error detection and correction by the standard ECC detection/correction part 242, (n−1) pages of page data 210 minus the standard ECCs 215 are input to the extended ECC generation part 243. An extended ECC 220 generated by the extended ECC generation part 243 is then input to the standard ECC generation part 241 through the selector 244.

The standard ECC generation part 241 adds standard ECC data 225 to the extended ECC 220 before outputting the data to the nonvolatile memory (NVM) 300. The output data is written to the nonvolatile memory 300 as the last page of the extended ECC block 230.

FIG. 4 is a schematic view showing a second composition example of the standard/extended ECC generation block as part of the first embodiment. The standard/extended ECC generation bloc 240A in FIG. 4 is constituted by the components of the standard/extended ECC generation bloc 240 in FIG. 3 plus a selector (SEL) 245. The selector 245 selects the output of either a data input line or the standard ECC detection/correction part 242 for input to the extended ECC generation part 243.

In the standard/extended ECC generation bloc 240A, write data is input to the standard ECC generation part 241 through the selector 244. With a standard ECC 215 added to the page data 210 to make up one page of data, the data is output and written to the nonvolatile memory (NVM) 300. Where an extended ECC is set for the standard/extended ECC generation bloc 240A, all page data 210 of the extended ECC block along with their standard ECCs 215 are read from the nonvolatile memory (NVM) 300.

Following error detection and correction by the standard ECC detection/correction part 242, (n−1) pages of page data 210 minus the standard ECCs 215 are input to the extended ECC generation part 243 through the selector 245. An extended ECC 220 generated by the extended ECC generation part 243 is input to the standard ECC generation part 241 through the selector 244.

The standard ECC generation part 241 adds standard ECC data 225 to the extended ECC 220 before outputting the data to the nonvolatile memory (NVM) 300. The output data is written to the nonvolatile memory 300 as the last page of the extended ECC block 230.

Where the page data 210, standard ECC 215, and extended ECC 220 are to be set simultaneously, (n−1) pages of write data are input to the standard ECC generation part 241 through the selector 244. With the standard ECC 215 added to the page data 210 to make up one page of data, the data is output and written to the nonvolatile memory (NVM) 300.

Parallelly, (n−1) pages of page data 210 are also input to the extended ECC generation section 243 through the selector 245. An extended ECC 220 generated by the extended ECC generation section 243 is input to the standard ECC generation part 241 through the selector 244. The extended ECC 220 is supplemented with standard ECC data 225 to form one-page data of the extended ECC block 230. The data is then output to the nonvolatile memory 300 and written thereto as the last page of the extended ECC block 230.

FIG. 5 is a schematic view showing a composition example of an ECC detection/correction block as part of the first embodiment. The ECC detection/correction block 250 in FIG. 5 includes a standard ECC detection/correction part 251, an extended ECC detection/correction 252, and a selector (SEL) 253.

In the ECC detection/correction block 250, the page data 210 and standard ECC 215 read from the nonvolatile memory (NVM) 300 are input to the standard ECC detection/correction part 251. Following error detection and correction by the standard ECC detection/correction part 251, the data is output to the host device 100 through the selector 253.

Where an extended ECC is to be set, all page data 210 and their standard ECCs 215 read from the nonvolatile memory (NVM) 300 are input to the extended ECC detection/correction part 252. Then (n−1) pages of the corrected page data 210 minus the standard ECCs 215 are input to the extended ECC detection/correction part 252. Following error detection and correction by the extended ECC detection/correction part 252, the page data ranging from page PG0 to page PGn−2 are output to the host device 100 through the selector 253.

The page data 210 from which no error was detected by the standard ECC detection/correction part 251 and the page data 210 of which any error has been corrected thereby may be output to the host device 100 without undergoing error detection using the extended ECC 220.

The memory interface section 204 of the memory controller 200 converts commands coming from the nonvolatile memory control section 202 into memory interface protocol before sending them to the nonvolatile memory 300.

The memory controller 200 manages three areas: a data area 303 where data 210 ranging from page 0 to page n−2 of the extended ECC block 230 exist; a standard ECC area 304 where standard ECCs 215 and 225 for page 0 through page n−1 exist; and an extended ECC area 305 where the extended ECC 220 of the last page n−1 exists. The Last page 220 of the extended ECC block 230 has a format such as one shown in FIG. 9. The memory controller 200 determines whether the extended ECC 220 of the past page n−1 has been set depending on the value of an extended ECC validity flag FLEEV 402.

The nonvolatile memory 300 is made up of a memory interface section 301, a memory cell array 302, the data area 303, the standard ECC area 304, the extended ECC area 305, and a control section 306. The memory cell array 302 constituting a nonvolatile memory section is structured to include the data area 303, standard ECC area 304, and extended ECC area 305. The nonvolatile memory section is accessed via the memory interface section 301 as an address space having a plurality of extended ECC blocks 230.

The memory interface section 301 receives access requests from the memory controller 200 and notifies the control section 306 thereof. In accordance with the received access request, the control section 306 writes or reads data by suitably controlling the memory cell array 302.

Figure 6:
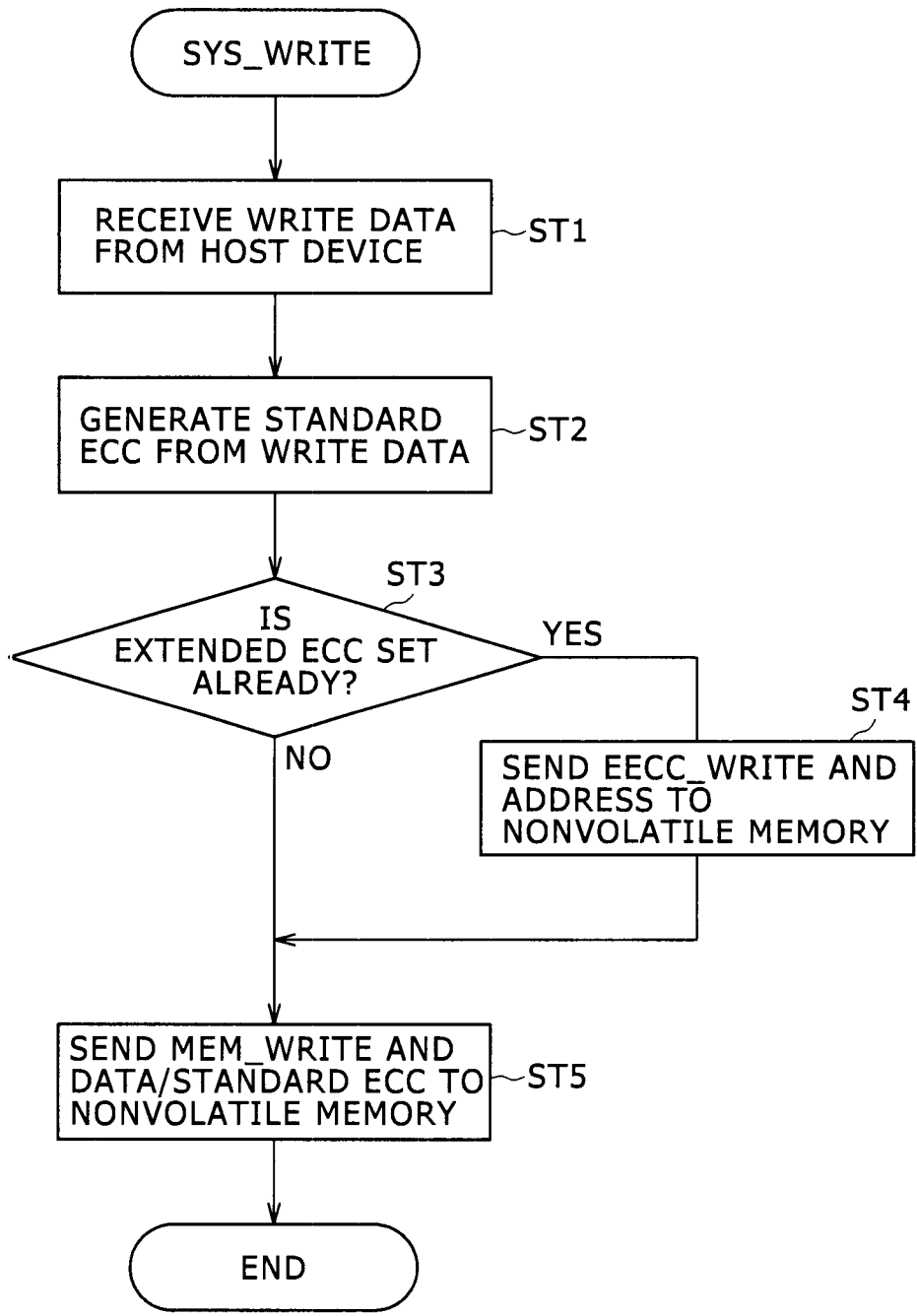
FIG. 6 is a flowchart explanatory of how a memory controller of the first embodiment operates upon receipt of a write command SYS_WRITE.

The workings of the host device 100, memory controller 200, and nonvolatile memory 300 will now be described. Explained first is a data write process by which to write data to the nonvolatile memory 300. FIG. 6 is a flowchart explanatory of how the memory controller 200 of the first embodiment operates upon receipt of a write command SYS_WRITE.

The memory controller 200 receives the command SYS_WRITE along with write data through the host interface section 201 and notifies the control unit 205 in the nonvolatile memory control section 202 thereof. The control unit 205 decodes the received command, determines that the command SYS_WRITE has been received, and receives the write data (in step ST1). The standard/extended ECC processing unit 206 then generates a standard ECC 215 to be added to each access unit of the data 210 (in step ST2).

The control unit 205 proceeds to determine using the extended ECC validity flag FLEEV 402 whether the extended ECC 220 is valid with regard to the address to which to write data (in step ST3). If the extended ECC 220 is found to be valid, then the control unit 205 sends a command EECC_WRITE to the nonvolatile memory and clears the flag FLEEV 402 (in step ST4).

Later, the control unit 205 sends the write command MEM_WRITE as well as the page data 210 and standard ECC 215 held in the data buffer section 203 to the nonvolatile memory 300 through the memory interface section 204 (in step ST5).

Figure 7:
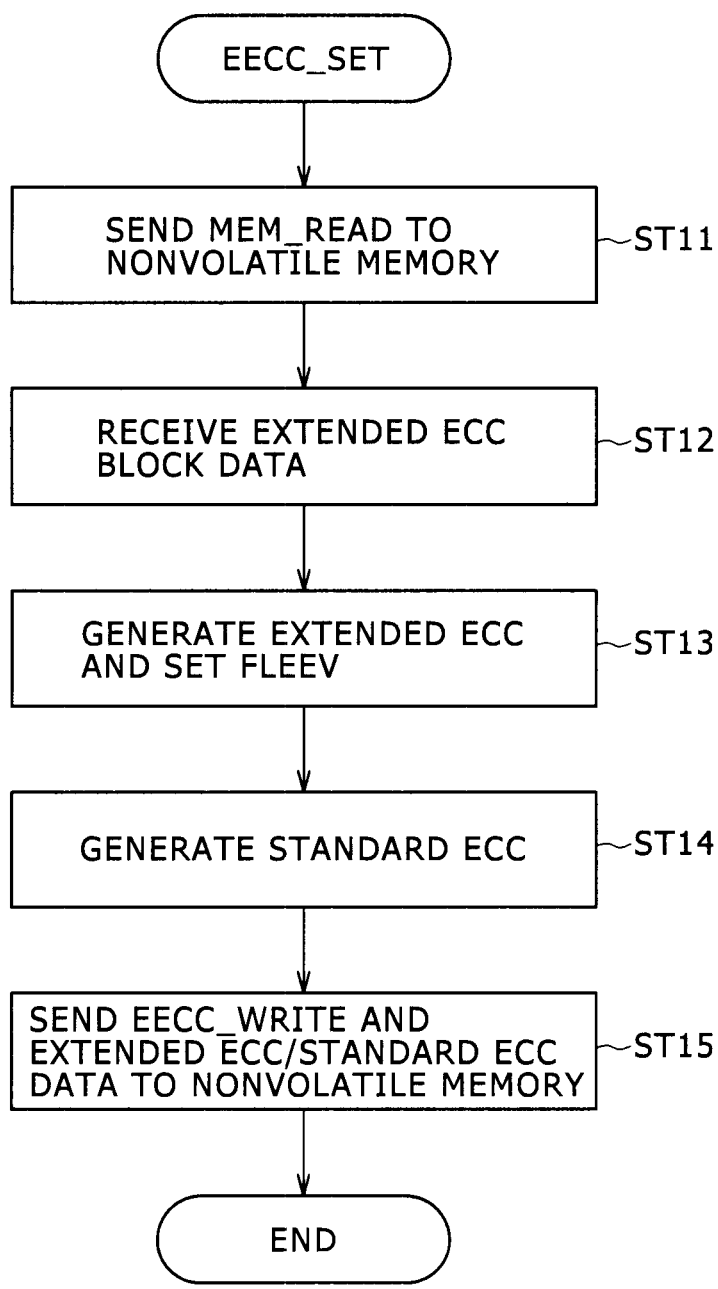
FIG. 7 is a flowchart explanatory of how the memory controller of the first embodiment operates upon receipt of an extended ECC set command EECC_SET.

Explained next is an extended ECC setting process by which to set an extended ECC for the nonvolatile memory 300. FIG. 7 is a flowchart explanatory of how the memory controller 200 of the first embodiment operates upon receipt of an extended ECC set command EECC_SET.

The host device 100 sets an extended ECC illustratively for the data to be stored for a prolonged period of time in the nonvolatile memory 300 so as to improve data retention characteristics. The host device 100 selects from the data in the nonvolatile memory 300 the extended ECC block 230 for which the extended ECC is to be set, and sends the starting address of the selected extended ECC block 230 to the memory controller 200 as the argument of the extended ECC set command EECC_SET.

The memory controller 200 receives the extended ECC set command EECC_SET through the host interface section 201 and notifies the control unit 205 in the nonvolatile memory control section 202 thereof. The control unit 205 decodes the received command and determines that the command EECC_SET has been received. Using the command MEM_READ, the control unit 205 reads successively the data 210 of the extended ECC block 230 to be protected by the extended ECC along with the standard ECCs 215 from the nonvolatile memory 300 into the data buffer section 203 (in step ST11). In this case, an error detection and correction process based on the standard ECC is carried out (in step ST12).

From the data in the data buffer section 203, the standard/extended ECC processing unit 206 generates an extended ECC 220. The control unit 205 sets the extended ECC validity flag FLEEV 402 to the extended ECC 220 (in step ST13). The standard/extended ECC processing unit 206 generates a standard ECC 225 with regard to the extended ECC 220 (in step ST14). The control unit 205 outputs the extended ECC write command EECC_WRITE, extended ECC 220, and standard ECC 225 to the nonvolatile memory 300 through the memory interface section 204 (in step ST15).

Figure 8:
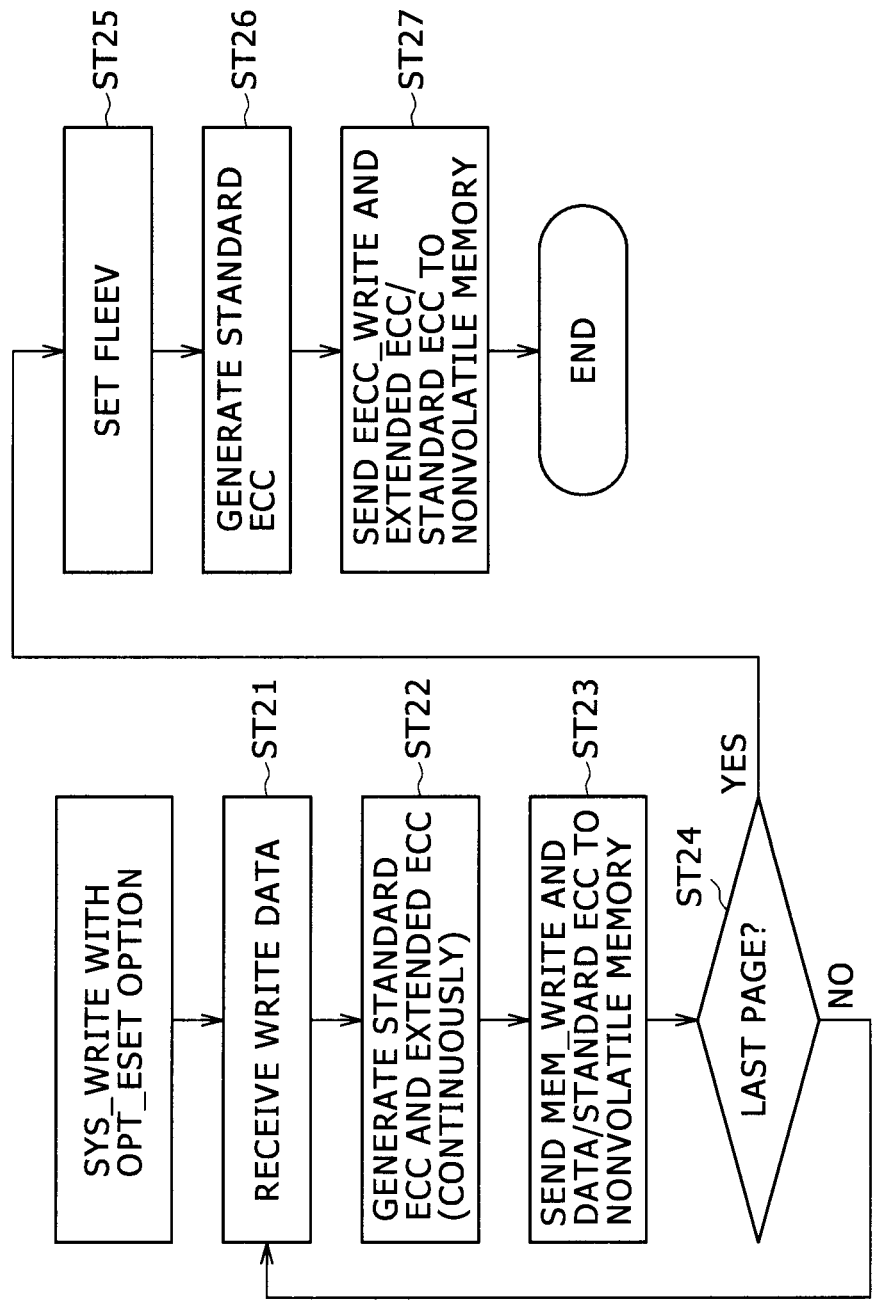
FIG. 8 is a flowchart explanatory of how the memory controller of the first embodiment operates upon receipt of the write command SYS_WRITE with an extended ECC set option OPT_ESET in effect.

Explained below is what takes place when the extended ECC is set at the same time as data is written to the nonvolatile memory 300. FIG. 8 is a flowchart explanatory of how the memory controller 200 of the first embodiment operates upon receipt of a write command SYS_WRITE with its option OPT_ESET put in effect to set the extended ECC simultaneously.

The host device 100 sends to the memory controller 200 the data write command SYS_WRITE with its option OPT_ESET set along with write data. In the memory controller 200, the host interface section 201 receives the command SYS_WRITE and the write data into the data buffer section 203 and notifies the control unit 205 in the nonvolatile memory control section 202 thereof.

The control unit 205 determines that the command SYS_WRITE has been received (in step ST21). The standard/extended ECC processing unit 206 generates a standard ECC to be added per access unit while generating an extended ECC in parallel (in step ST22). The control unit 205 outputs to the nonvolatile memory 300 the write command MEM_WRITE as well as the data 210 and standard ECC 215 held in the data buffer section 203 (in step ST23

After performing the above process up to page n−2 of the extended ECC block 230 (in step ST24), the control unit 205 sets the flag FLEEV 402 to the generated extended ECC 220 (in step ST25). The standard/extended ECC processing unit 206 further generates a standard ECC 225 with regard to the extended ECC 225 (in step ST26). The control unit 205 then outputs the write command EECC_WRITE as well as the extended ECC 220 and standard ECC 225 held in the data buffer section 203 (in step ST27 to the nonvolatile memory 300 through the memory interface section 204.

Figure 9:
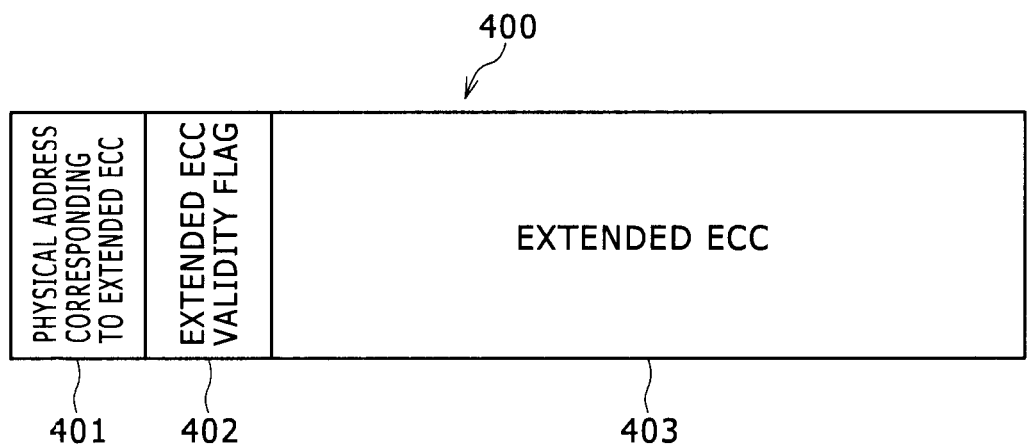
FIG. 9 is a schematic view showing a typical format of an extended ECC to be stored in an extended ECC area.

FIG. 9 is a schematic view showing a typical format of the extended ECC to be stored in the extended ECC area. The extended ECC 400 in FIG. 9 is made up of three fields: a physical address field 401 indicating the extended ECC block 230 to be protected by the extended ECC, an extended ECC validity flag field FLEEV 402, and an extended ECC field 403.

Figure 10:
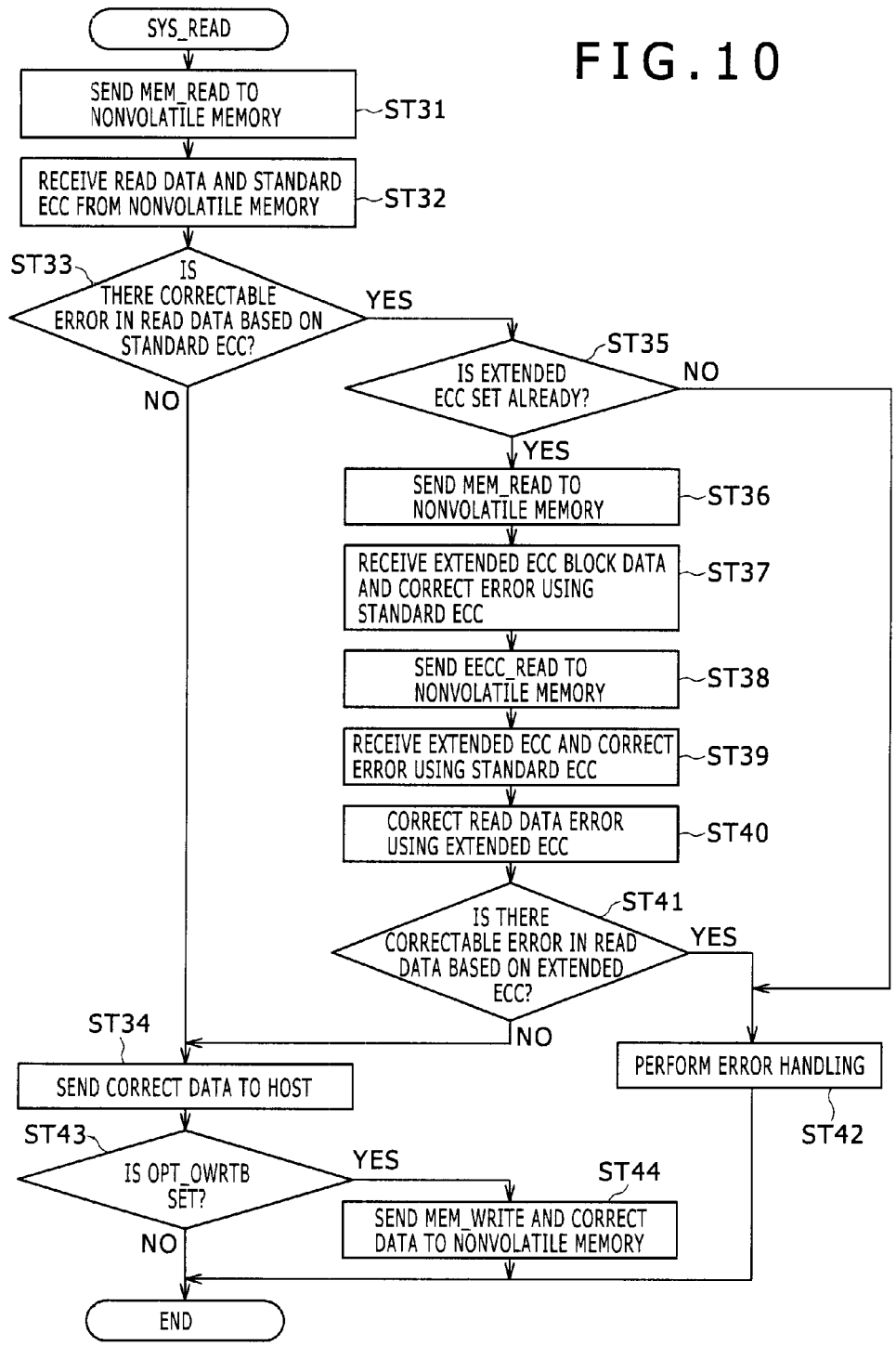
FIG. 10 is a flowchart explanatory of how the memory controller of the first embodiment operates upon receipt of a read command SYS_READ.

How data is read from the nonvolatile memory 300 is explained below. FIG. 10 is a flowchart explanatory of how the memory controller 200 of the first embodiment operates upon receipt of a read command SYS_READ.

The host device 100 sends the data read command SYS_READ to the memory controller 200. On receiving the read command SYS_READ from the host device 100, the host interface section 201 of the memory controller 200 notifies the control unit 205 in the nonvolatile memory control section 202 thereof. The control unit 205 decodes the received command, determines that the read command SYS_READ has been received, and sends a read command MEM_READ to the nonvolatile memory 300 through the memory interface section 204 (in step ST31).

The control unit 205 sends data 210 and a standard ECC 215 to the data buffer section 203 through the memory interface section 204. The standard/extended ECC processing unit 206 performs an error detection process using the standard ECC to correct any error of the data in the data buffer section 203 (in step ST33).

If no error is detected in step ST33 or if the error detected in step ST33 is found correctable using the standard ECC, then the control unit 205 sends the data 210 held in the data buffer section 203 to the host device through the host interface section 201 (in step ST34).

If in step ST33 the detected error is found uncorrectable using the standard ECC, then the control unit 205 checks the value of the extended ECC validity flag FLEEV 402 (in step ST35). If in step ST35 the flag FLEEV 403 is found to have been cleared, that means the extended ECC is not set. In that case, the control unit 205 performs error handling before terminating the process (in step ST42).

If in step ST35 the flag FLEEV 402 is found to be set, then the control unit 205 using the command MEM_READ receives all pages of the extended ECC block 230 from the nonvolatile memory 300 into the data buffer section 203 (in step ST36). In this case, an error correction process is carried out using the standard ECC, and any error uncorrectable by the standard ECC is received uncorrected into the data buffer section 203 (in step ST37).

The control unit 205 reads the extended ECC 220 and standard ECC 225 using the command EECC_READ (in step ST38). The standard/extended ECC processing unit 206 performs an extended ECC error correction process using the standard ECC 225 (in step ST39), and carries out a data error detection and correction process on the data buffer section 203 using the extended ECC 220 (in step ST40). In this step, the data uncorrectable by the standard ECC is corrected using the extended ECC.

If in step ST41 no error is found to be uncorrectable by the extended ECC, the control unit 205 sends the corrected data held in the data buffer section 203 to the host device 100 through the host interface section 201 (in step ST34). If in step ST42 any error is found to be uncorrectable even by the extended ECC, then the control unit 205 performs error handling (in step ST42) and terminates the process.

After the processing in step ST34, the control unit 205 determines whether a corrected data write-back option OWET3 is set in the read command SYS_READ coming from the host device 100 (in step ST43). If the option is found to be set, the control unit 205 writes the corrected data held in the data buffer section 203 back to the nonvolatile memory 300 using the commands MEM_WRITE and EECC_WRITE (in step ST44).

Figure 11:
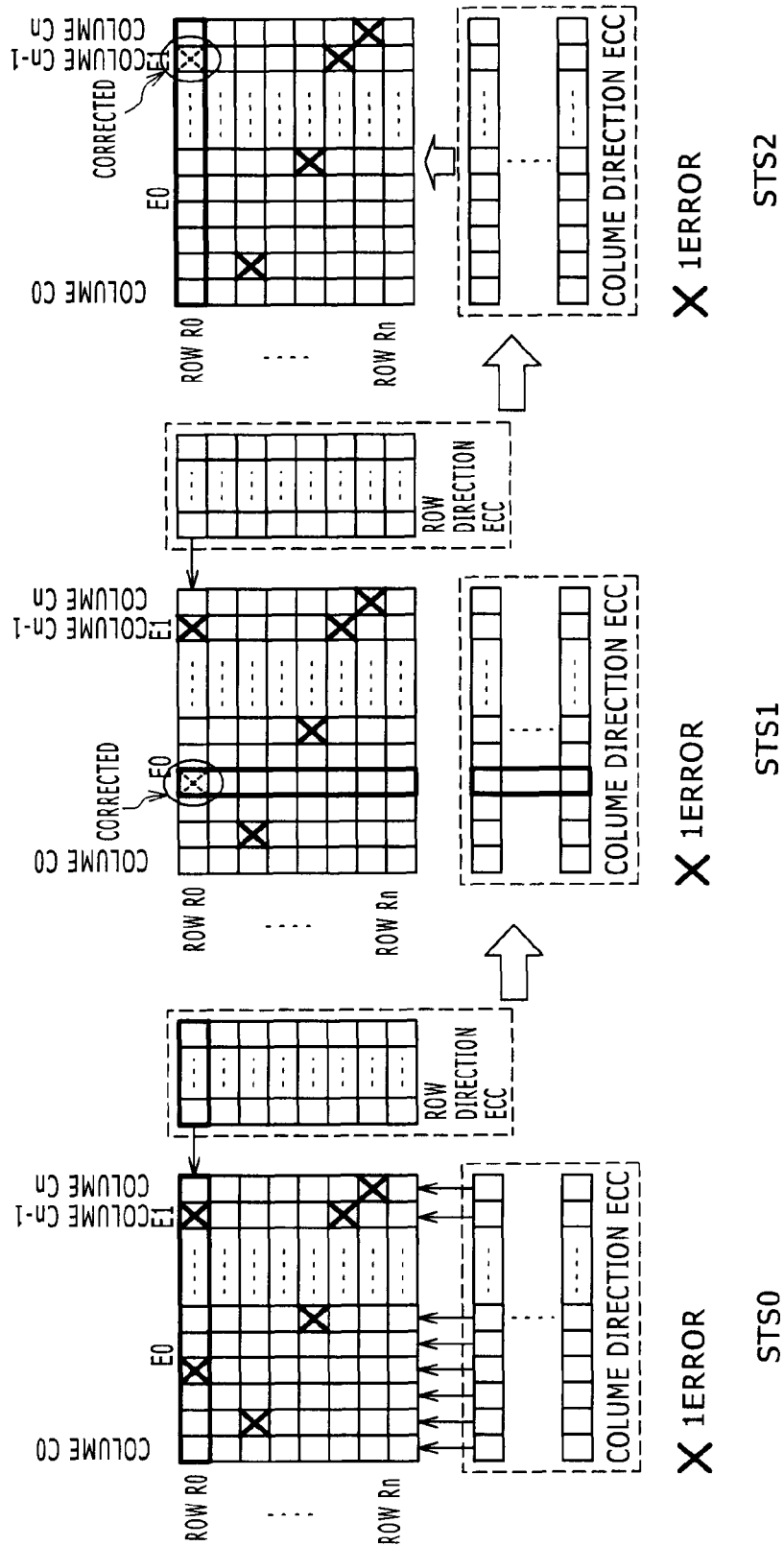
FIG. 11 is a schematic view explanatory of how an error correction capability is reinforced where a product code is used as the extended ECC.
Figure 12:
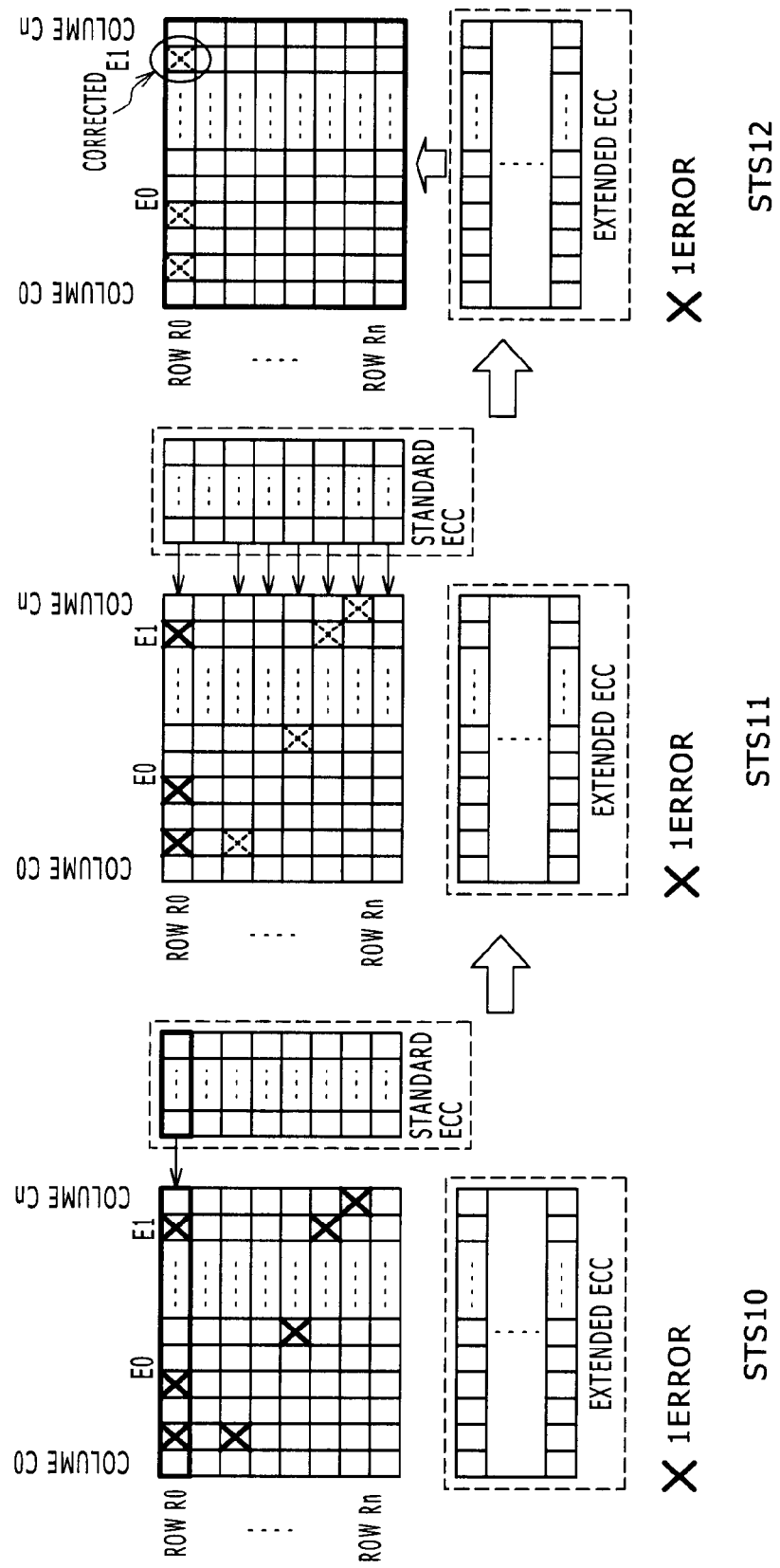
FIG. 12 is a schematic view explanatory of how the error correction capability is reinforced where multiple error correction codes are used as the extended ECC.

Explained below is a specific example in which a product code is used as the extended ECC, followed by another example in which multiple error correction codes are used as the extended ECC, each example showing how data uncorrectable by the standard ECC is corrected in practice by the extended ECC. FIG. 11 is a schematic view explanatory of how the product code is used as the extended ECC for error detection and correction, and FIG. 12 is a schematic view explanatory of how multiple error correction codes are used as the extended ECC for error detection and correction.

How the product code is used as the extended ECC is first explained below in reference to FIG. 11. Using the product code as the extended ECC involves calculating an ECC in each of the row and column directions of a block of data arrayed in the two directions and repeating corrections in the row and column directions to correct errors in each direction.

FIG. 11 shows an example in which one error can be corrected in each of the rows and columns. The ECCs in the row direction are stored in the standard ECC area, and the ECCs in the column direction are held in the extended ECC area. Upon ordinary access, only the ECC in the direction of each row corresponding to the standard ECC is used. The extended ECC is the combination of a row-direction ECC with a column-direction ECC and the value of the row-direction ECC coincides with that of the standard ECC, so that the extended ECC need not be stored in the extended ECC area.

Where a row R0 is to be read, the row R0 is found to have developed two errors E0 and E1 and thus cannot be corrected using the standard ECC corresponding to this row (status STS0). In this case, error correction is performed in the column direction from column C0 to column Cn using the extended ECC. This corrects the error E0 using the column-direction ECC. However, the correction fails to handle two errors that have developed in a column Cn−1 (status STS1). A return to the readout of the row R0 in the row direction runs into only one error E1 in that row. This time, the correction is made using the row-direction ECC to correct all errors in the row R0 (status STS2). Thus the data of the row R0 is correctly read.

As described, the product code-based error correction scheme is characterized in that even if error correction is unavailable in the initial status (i.e., status STS0), corrections are repeated in the row and column directions so as to correct all errors. With the first embodiment, the row-direction ECC and column-direction. ECC are processed using the standard ECC and extended ECC, respectively. The error correction capability is reinforced even if the same error correction scheme is utilized in the row and column directions. This provides the advantage of a single circuit generating standard and extended ECCs and carrying out the error correction process as well.

How multiple error correction codes are used as the extended ECC is explained next in reference to FIG. 12. FIG. 12 is an example in which the Hamming code capable of single-error correction is used as the standard ECC while the BCH code capable of quadruple-error correction is used as the extended ECC.

Where a row R0 is to be read, that row is found to have developed three errors so that the data of the row cannot be corrected using the standard ECC (status STS10). In this case, the data to be protected by the extended ECC is read out. Because all errors other than those of the row R0 are each found in a single row, these errors are corrected using the standard ECC (status STS1).

The data to be protected by the extended ECC has three errors. Since the extended ECC is capable of quadruple-error correction, these three errors can be corrected using the extended ECC (status ST12).

As described, the extended ECC 220 is attached to each of the extended ECC blocks 230. This arrangement permits correction of the errors that cannot be corrected using the standard ECC 215 only.

Figure 13:
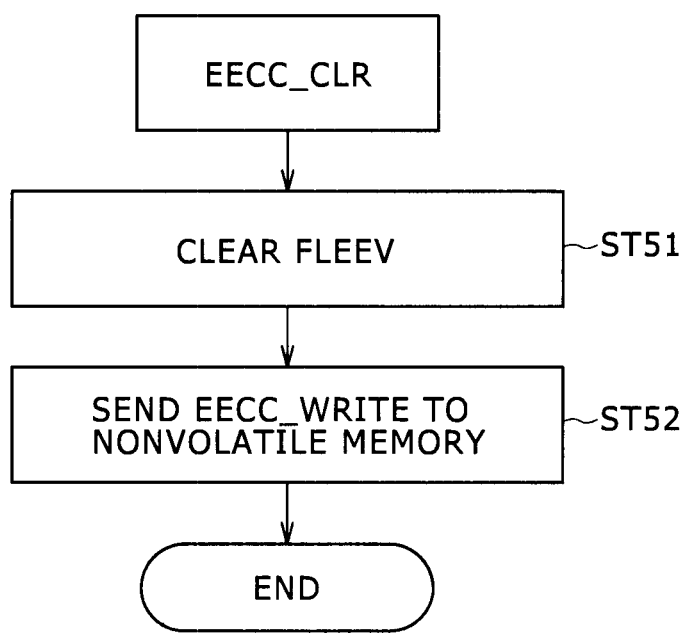
FIG. 13 is a flowchart explanatory of how the memory controller of the first embodiment operates upon receipt of an extended ECC clear command.

How the extended ECC set by the host device 100 is cleared will now be described. FIG. 13 is a flowchart explanatory of how the memory controller 200 of the first embodiment operates upon receipt of an extended ECC clear command EECC_CLR.

The host device 100 sends the extended ECC clear command EECC_CLR to the memory controller 200. On receiving the command, the host interface section 201 of the memory controller 200 notifies the control unit 205 in the nonvolatile memory control section 202 thereof. The control unit 205 decodes the received command and determines that the extended ECC clear command EECC_CLR has been received.

The control unit 205 prepares the data from which the extended ECC validity flag FLEEV 402 has been cleared (in step ST51). The control unit 205 sends the extended ECC write command EECC_WRITE to the nonvolatile memory 300 through the memory interface 204, thereby clearing the designated extended ECC in the extended ECC block of the extended ECC area 305 (in step ST52).

2. Second Embodiment

FIG. 14 is a schematic view showing a configuration example of a memory system 10A which constitutes the second embodiment of the present invention and which includes a nonvolatile memory apparatus according to the invention. The memory system 10A of the second embodiment differs from the memory system 10 of the first embodiment in the following aspects:

In the memory system 10 of the first embodiment, the memory controller 200 processes both standard and extended ECCs. In the memory system 10A of the second embodiment, by contrast, the standard ECCs are processed by a nonvolatile memory 300A.

Accordingly, a nonvolatile memory control section 202A of a memory controller 200A in the memory system 10A includes an extended ECC processing unit 207 replacing the standard/extended ECC processing unit of the first embodiment. The nonvolatile memory 300A contains a data buffer section 307 and a standard ECC processing section 308, both controlled by the control section 306.

As with the first embodiment, the host device 100 of the second embodiment issues the commands SYS_WRITE, SYS_READ, EECC_SET, EECC_GET, and EECC_CLR to the memory controller.

In the second embodiment, the nonvolatile memory 300A includes three functions: the function of generating standard ECCs, the function of performing error detection and correction using the standard ECCs, and the function of notifying the memory controller 200A of any error uncorrectable by the standard ECC.

The memory controller 200A issues the commands MEM_WRITE, MEM_READ, EECC_READ, and EECC_WRITE to the nonvolatile memory 300A but does not add the standard ECC to data upon data transfer thereto unlike in the first embodiment. More specifically, upon a data write using the command MEM_WRITE, the memory controller 200A does not include the standard ECC into the received data. It is the nonvolatile memory 300A that internally adds the standard ECC to the data for storage therein. Upon a data read using the command MEM_READ, the nonvolatile memory 200A sends the data corrected by the standard ECC to the memory controller 200A.

When an extended ECC is to be stored using the command EECC_WRITE, no standard ECC is included in the received extended ECC information. The nonvolatile memory 300A internally adds the standard ECC to the extended ECC information for storage therein. When an extended ECC is to be read using the command EECC_READ, the nonvolatile memory 300A sends the extended ECC corrected by the standard ECC to the memory controller 200A.

What follows is a description of how the nonvolatile memory 300A generates a standard ECC when writing data using the command MEM_WRITE and how the nonvolatile memory 300A carries out error detection and correction upon reading data using the command MEM_READ.

When data is to be written to the nonvolatile memory 300A using the command MEM_READ, the nonvolatile memory 300A receives the command through the memory interface section 301, notifies the control section 306 thereof, and receives the write data into the data buffer section 307. The control section 306 decodes the command, determines the command to be MEM_WRITE, creates a standard ECC from the write data held in the data buffer section 307, writes the data to the data area 303, and writes the standard ECC to the standard ECC area 304.

When data is to be read from the nonvolatile memory 300A using the command MEM_READ, the nonvolatile memory 300A receives the command through the memory interface section 301 and notifies the control section 306 thereof. The control section 306 decodes the command, determines the command to be MEM_READ, reads the data from the data area 303 and standard ECC area 304 into the data buffer section 307, causes the standard ECC processing section to perform error detection and correction of the data, and sends the data to the memory controller 200A through the memory interface section 301. If any uncorrectable error is detected, the control section 306 notifies the memory controller 200A thereof and sends the uncorrected data to the memory controller 200A through the memory interface section 301.

Described below is how the memory controller 200A works when reading data using the command SYS_READ. FIG. 15 is a flowchart explanatory of how the memory controller 200A of the second embodiment operates upon receipt of the command SYS_READ. What takes place in steps ST32A, ST33A, ST37A, and ST39A is different from the comparable processing by the first embodiment of which the flowchart is shown in FIG. 10. The other steps are the same as those of the first embodiment.

With the second embodiment, the data corrected by the standard ECC is received in steps ST32A, ST37A, and ST39A. In step ST33A, the memory controller 200A receives from the nonvolatile memory 300A information indicating whether there has occurred an error uncorrectable by the standard ECC, and determines whether or not to perform an extended ECC process. If the data is found to have developed an uncorrectable error in the standard ECC processing section inside the nonvolatile memory 300A, then the uncorrected data is output to the memory controller 200A.

3. Third Embodiment

FIG. 16 is a schematic view showing a configuration example of a memory system 10B which constitutes the third embodiment of the present invention and which includes a nonvolatile memory apparatus according to the invention. The memory system 10B of the third embodiment differs from the memory system 10 of the first embodiment in the following aspects:

In the memory system 10 of the first embodiment, the memory controller 200 processes standard and extended ECCs. In the memory system 10B of the third embodiment, by contrast, the standard ECCs are processed by a memory controller 200B and the extended ECCs by a host device 100B.

Accordingly, a nonvolatile memory control section 202B of the memory controller 200B in the memory system 10B contains a standard ECC processing unit 208 replacing the standard/extended ECC processing unit. The host device 100B includes an extended ECC processing section 103 that is controlled by the CPU 101.

The extended ECC processing section 103 of the host device 100B may be implemented using either hardware or software.

In the third embodiment, the host device 100B includes the function of generating an extended ECC and the function of performing error detection and correction using the extended ECC. The host device 100B issues the commands SYS_WRITE, SYS_READ, EECC_SET, EECC_GET, and EECC_CLR to the memory controller 200B. Unlike in the first embodiment, the host device 100B issues these commands not only for data access but also for extended ECC processing.

The write operation by use of the command SYS_WRITE is the same as with the first embodiment. In the case of the read operation based on the command SYS_READ, the memory controller 200B has the function of giving notification that an error uncorrectable by the standard ECC has occurred, unlike in the first embodiment. On receiving the error uncorrectable by the standard ECC from the memory controller 200B, the host device 100B reads the page data 210 of the extended ECC block 230 using the command SYS_READ and performs error correction using the extended ECC.

The extended ECC is set using the command EECC_SET. Unlike in the first embodiment, the host device 100B sends the command EECC_SET along with an extended ECC in the format shown in FIG. 9 to the memory controller 200B.

The extended ECC is read using the command EECC_GET in the same manner as with the first embodiment. The extended ECC is cleared using the command EECC_CLR also in the same manner as with the first embodiment.

The memory controller 200B issues the commands MEM_WRITE, MEM_READ, EECC_WRITE, and EECC_READ to the nonvolatile memory 300 in the same manner as with the first embodiment.

Figure 17A:
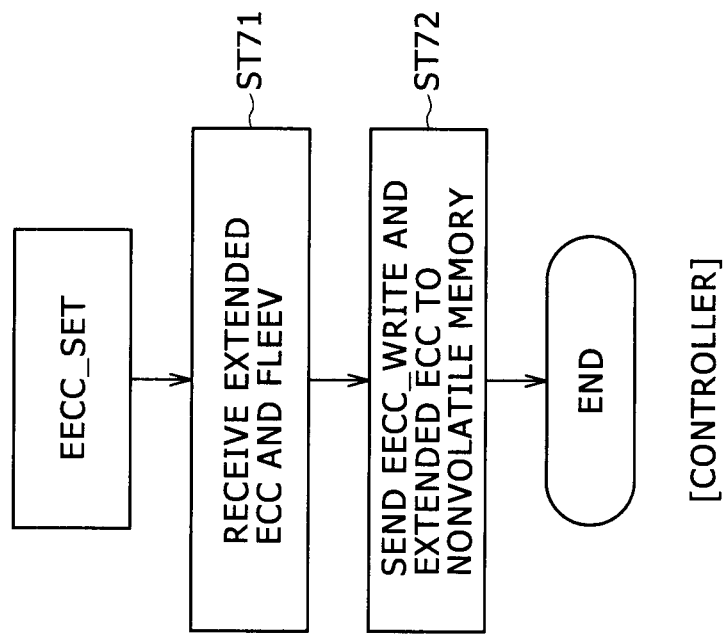
FIGS. 17A and 17B are flowcharts explanatory of how a host device transmitting the extended ECC set command EECC_SET and a memory controller receiving the transmitted command operate as part of the third embodiment.
Figure 17B:
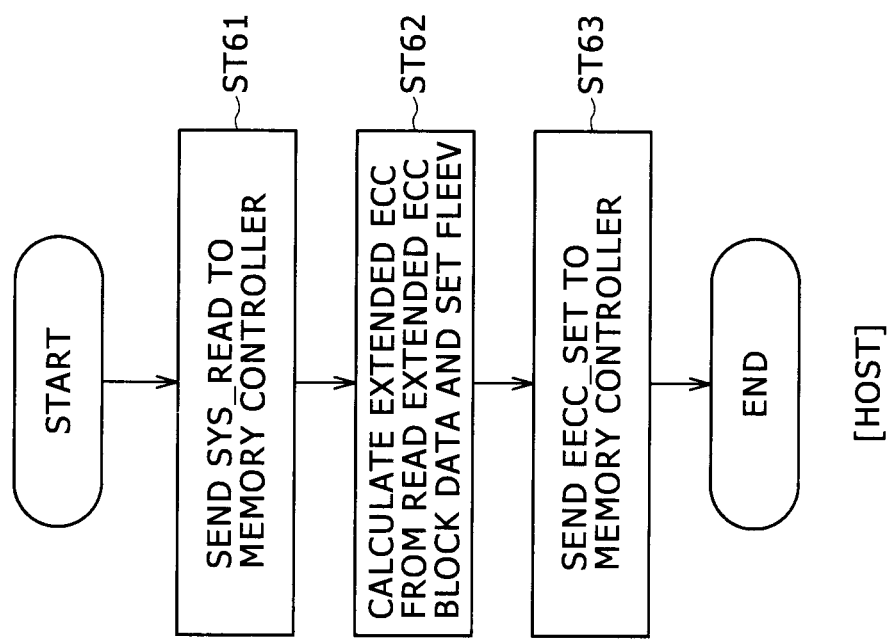

Described below are the operations characteristic of the third embodiment when the commands EECC_SET and SYS_READ are carried out. FIGS. 17A and 17B are flowcharts explanatory of how the host device 100B and memory controller 200B operate as part of the third embodiment upon processing of the command EECC_SET. FIG. 17A shows how the host device 100B works and FIG. 17B indicates how the memory controller 200B operates.

In FIG. 17A, the host device 100B sends the command SYS_READ to the memory controller 200B so as to read the page data 210 of the extended ECC block 230 to be protected by an extended ECC (in step ST61). The host device 100B generates an extended ECC from the read data and sets an extended ECC validity flag FLEEV 402 (in step ST62. The host device 100B then sends the generated extended ECC together with the command EECC_SET to the memory controller 200B (in step ST63).

In FIG. 17B, the host interface section 201 in the memory controller 200B receives the command EECC_SET, notifies the control unit 205 in the nonvolatile memory control section 202B thereof, and writes the extended ECC 403 and extended ECC validity flag FLEEV 402 to the data buffer section 203.

The control unit 205 decodes the received command and determines that the command EECC_SET has been received. The control unit 205 then arranges the received extended ECC 403 and flag FLEEV 402 into the format shown in FIG. 9 (in step ST71), calculates the standard ECC, and sends the ECC along with the command EECC_WRITE to the nonvolatile memory 300 (in step ST72).

Figure 18:
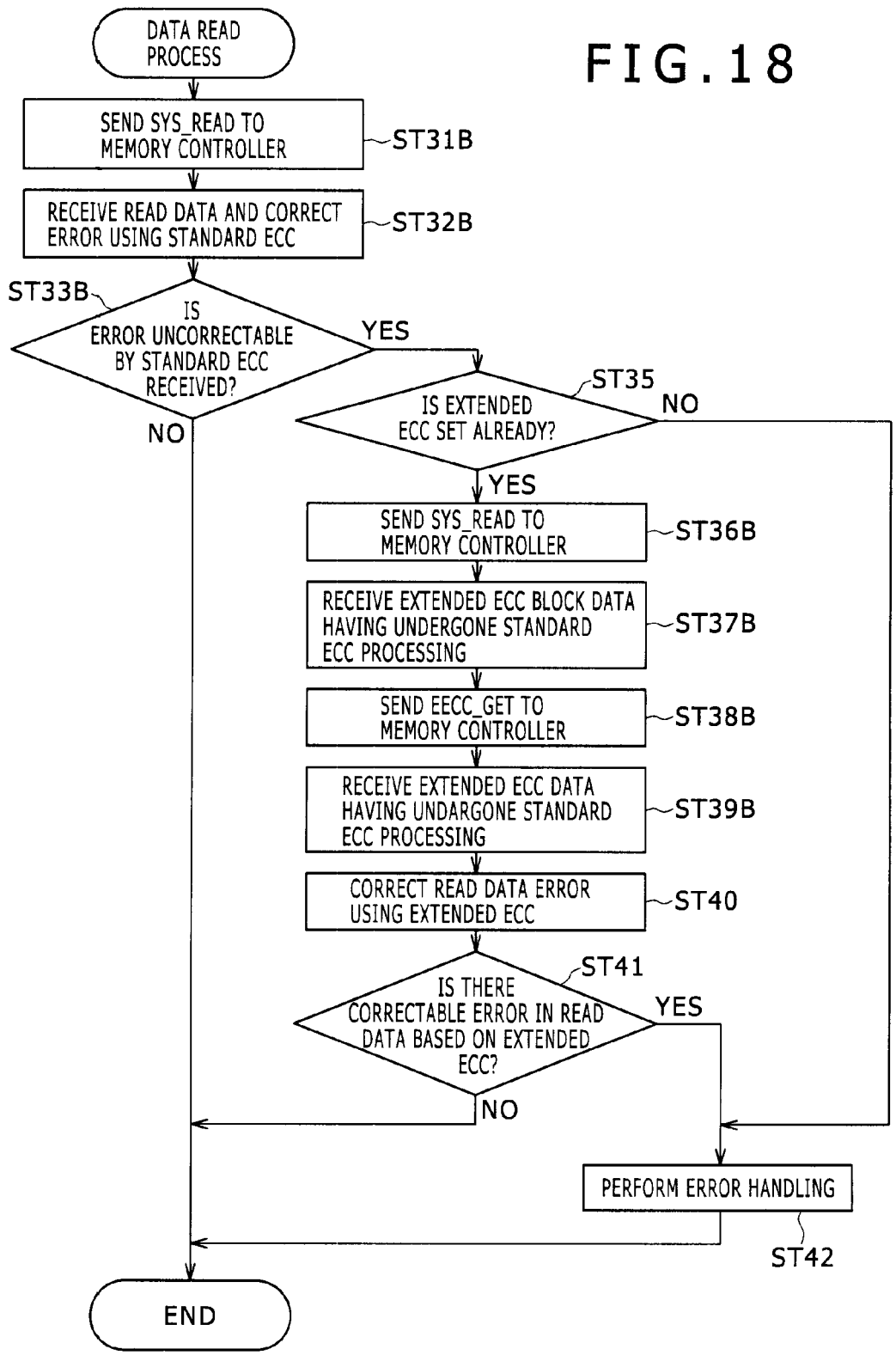
FIG. 18 is a flowchart explanatory of how the host device of the third embodiment operates upon reading data.

Explained below is an extended ECC correction process performed by the host device 100B of the third embodiment upon data readout. FIG. 18 is a flowchart explanatory of how the host device 100B operates upon reading data.

The difference between the flowchart of FIG. 18 for the third embodiment and the flowchart of FIG. 10 for the first embodiment is this: that while the memory controller processes both standard and extended ECCs in the first embodiment, the host device and nonvolatile memory process extended and standard ECCs respectively in the third embodiment.

In steps ST31B and ST32B, the host device 100B reads data using the command SYS_READ. Upon receipt of notification that that an error uncorrectable by the standard ECC has occurred from the memory controller 200B in step ST33B, the host device 100B attempts to correct the error using the extended ECC (in steps ST36B through ST40B).

The host device 100B reads the page data 210 of the extended ECC block 230 using the command SYS_READ (in step ST36B). By this time, the received data 210 has been corrected using the standard ECC 215. If there is found an error uncorrectable by the standard ECC 215, the host device 100B receives the uncorrected data 210 (in step ST37B). The host device 100B then sends to the memory controller 200B the command EECC_GET by which to read the extended ECC 220 (in step ST38B), and receives the extended ECC 220 that has been corrected using the standard ECC (in step ST39B). Thereafter, steps ST40 and ST41 are the same as those of the first embodiment except that the processing is performed by the host device 100B.

4. Fourth Embodiment

Figure 19:
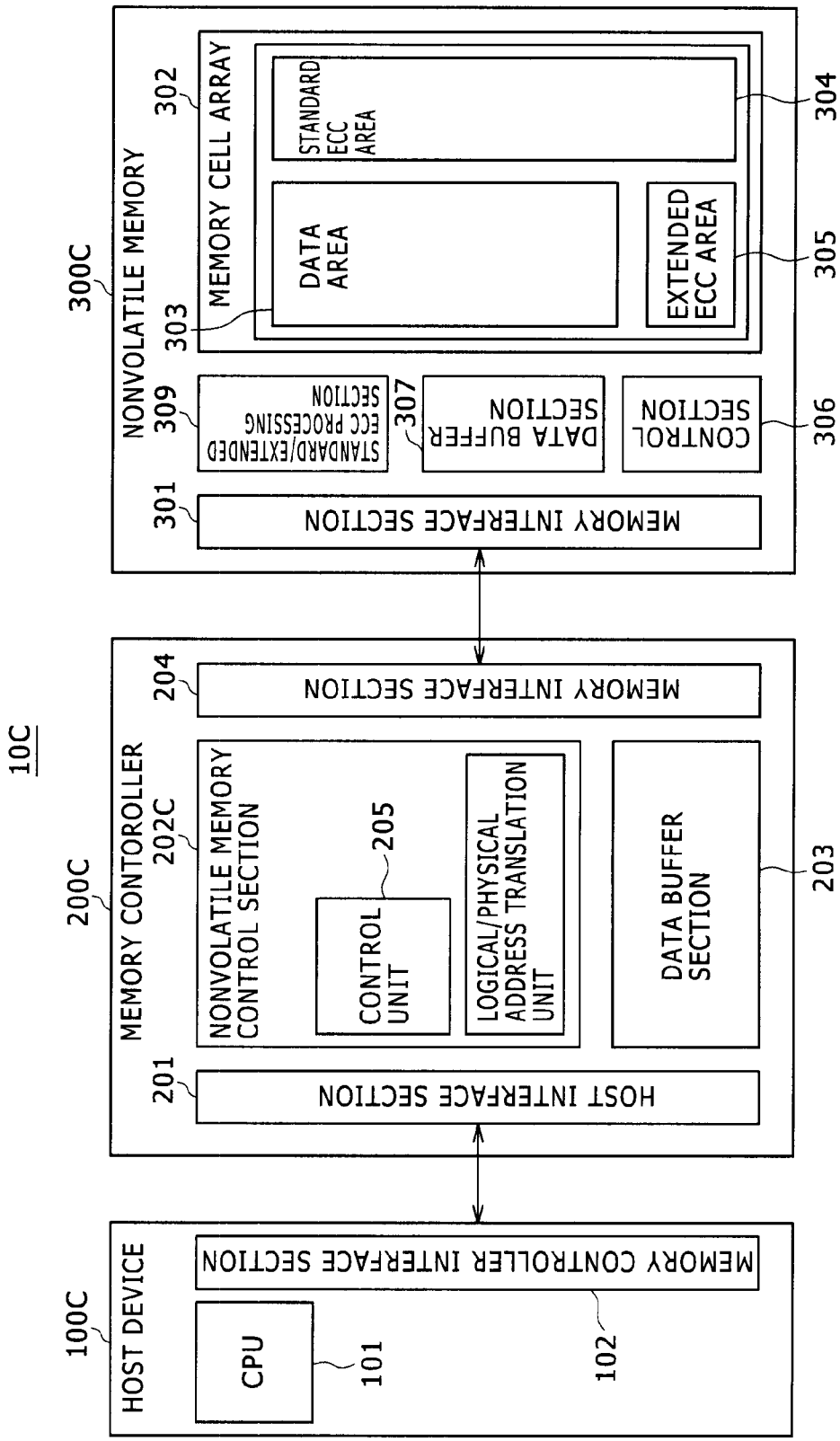
FIG. 19 is a schematic view showing a configuration example of a memory system which constitutes a fourth embodiment of the present invention and which includes a nonvolatile memory apparatus according to the invention.

FIG. 19 is a schematic view showing a configuration example of a memory system 100 which constitutes the fourth embodiment of the present invention and which includes a nonvolatile memory apparatus according to the invention. The memory system 100 of the fourth embodiment differs from the memory system 10 of the first embodiment in the following aspects:

In the memory system 10 of the first embodiment, the memory controller 200 processes both standard and extended ECCs. In the memory system 100 of the fourth embodiment, by contrast, the standard and extended ECCs are processed by a nonvolatile memory 300C.

Accordingly, a nonvolatile memory control section 202C of a memory controller 200C in the memory system 100 does not include the standard/extended ECC processing unit. The nonvolatile memory 300C contains the data buffer section 307 and standard/extended ECC processing section 309.

In the fourth embodiment, as explained above, the standard and extended ECCs are processed by the nonvolatile memory 300C; the processes carried out by the memory controller 200 in the first embodiment are taken over by the nonvolatile memory 300C in the fourth embodiment.

5. Fifth Embodiment

Figure 20:
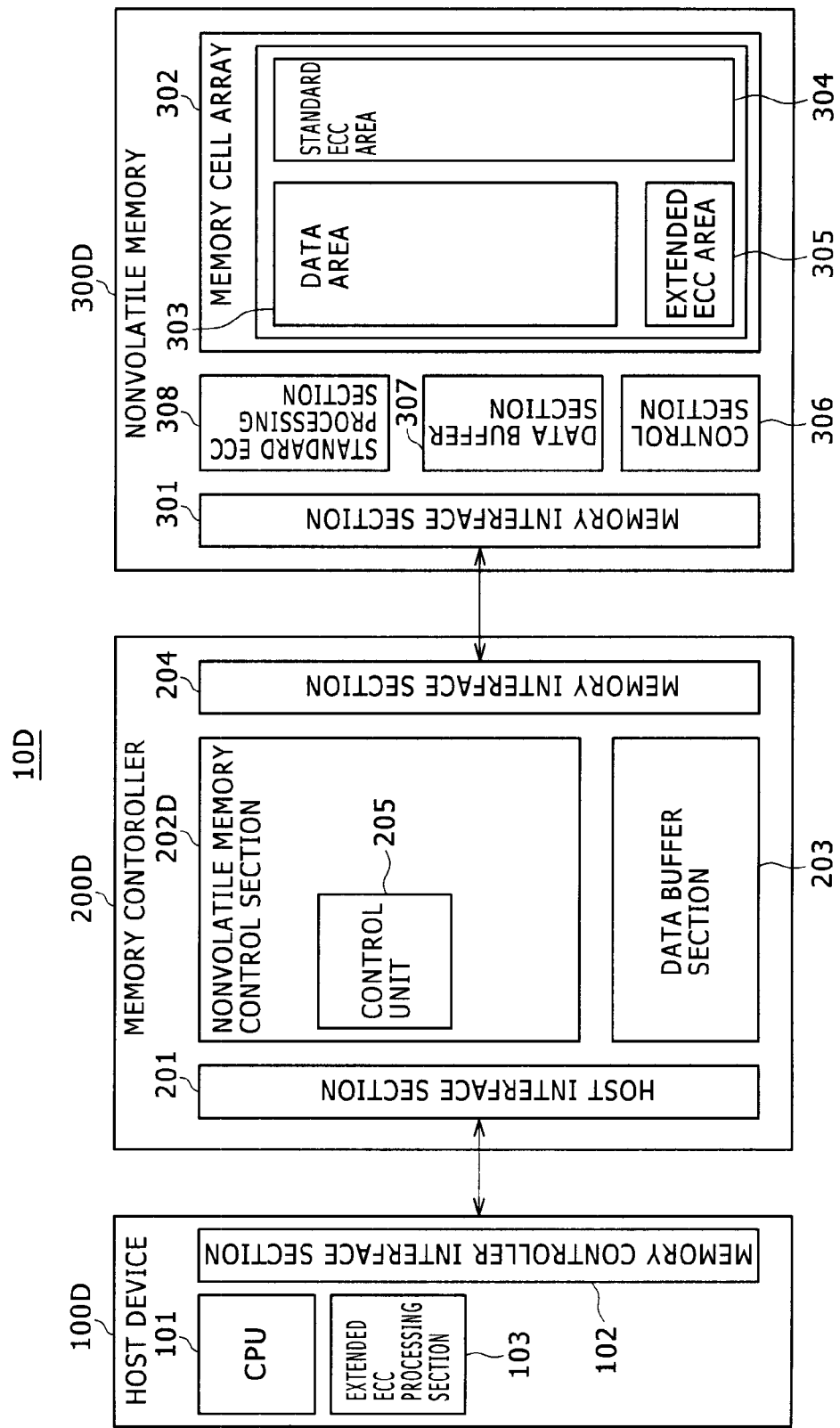
FIG. 20 is a schematic view showing a configuration example of a memory system which constitutes a fifth embodiment of the present invention and which includes a nonvolatile memory apparatus according to the invention.

FIG. 20 is a schematic view showing a configuration example of a memory system 10D which constitutes the fifth embodiment of the present invention and which includes a nonvolatile memory apparatus according to the invention. The memory system 10D of the fifth embodiment differs from the memory system 10 of the first embodiment in the following aspects:

In the memory system 10 of the first embodiment, the memory controller 200 processes both standard and extended ECCs. In the memory system 10D of the fifth embodiment, by contrast, the standard ECCs are processed by a nonvolatile memory 300D and the extended ECCs by a host device 100D.

Accordingly, a nonvolatile memory control section 202D of a memory controller 200D in the memory system 10D does not include the standard/extended ECC processing section. The nonvolatile memory 300D contains the data buffer section 307 and standard ECC processing section 308, and the host device 100D includes the extended ECC processing section 103.

In the fifth embodiment, as described above, the standard ECCs are processed by the nonvolatile memory 300D and the extended ECCs are handled by the host device 100D. The standard ECCs are processed in the same manner as with the second embodiment. The memory controller 200D does not have the function of processing extended ECCs. Instead, the memory controller 200D includes the function of notifying the host device 100D of any error which is uncorrectable by the standard ECC and which is output from the nonvolatile memory 300D. The extended ECCs are processed in the same manner as with the third embodiment.

6. Sixth Embodiment

Figure 21:
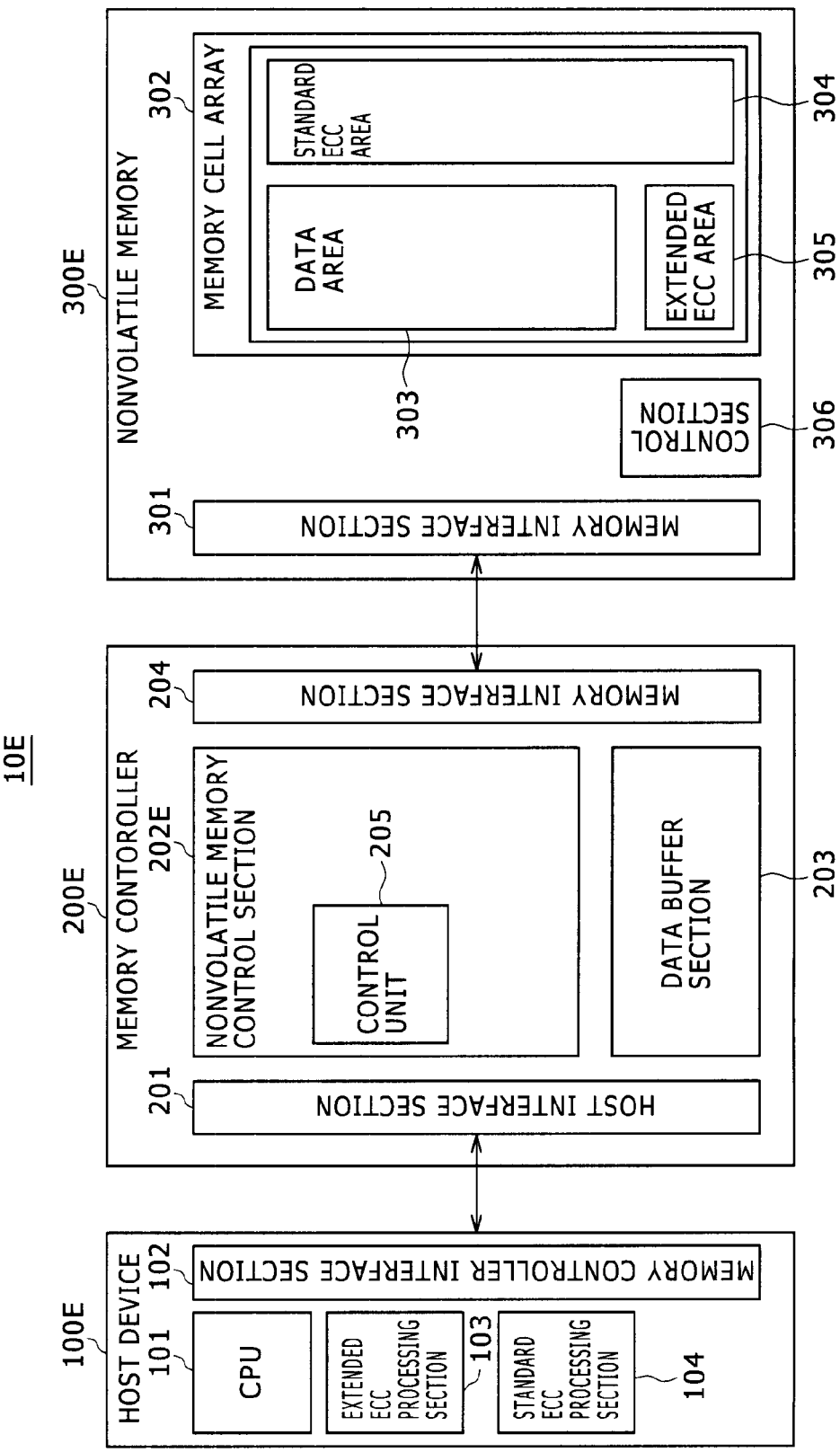
FIG. 21 is a schematic view showing a configuration example of a memory system which constitutes a sixth embodiment of the present invention and which includes a nonvolatile memory apparatus according to the invention.

FIG. 21 is a schematic view showing a configuration example of a memory system 10E which constitutes the sixth embodiment of the present invention and which includes a nonvolatile memory apparatus according to the invention. The memory system 10E of the sixth embodiment differs from the memory system 10 of the first embodiment in the following aspects:

In the memory system 10 of the first embodiment, the memory controller 200 processes both standard and extended ECCs. In the memory system 10E of the sixth embodiment, by contrast, the standard and extended ECCs are processed by a host device 100E.

Accordingly, a nonvolatile memory control section 202E of a memory controller 200E in the memory system 10E does not include the standard/extended ECC processing section. The host device 100E includes the extended ECC processing section 103 and a standard ECC processing section 104. Because the extended ECC processing section of the host device 100E needs to perform its processing when the standard ECC processing section has developed an uncorrectable error, this extended ECC processing section may be implemented by software.

In the sixth embodiment, as explained above, the standard and extended ECCs are processed by the host device 100E; the processes carried out by the memory controller 200 in the first embodiment are taken over by the host device 100E in the sixth embodiment.

7. Seventh Embodiment

Figure 22:
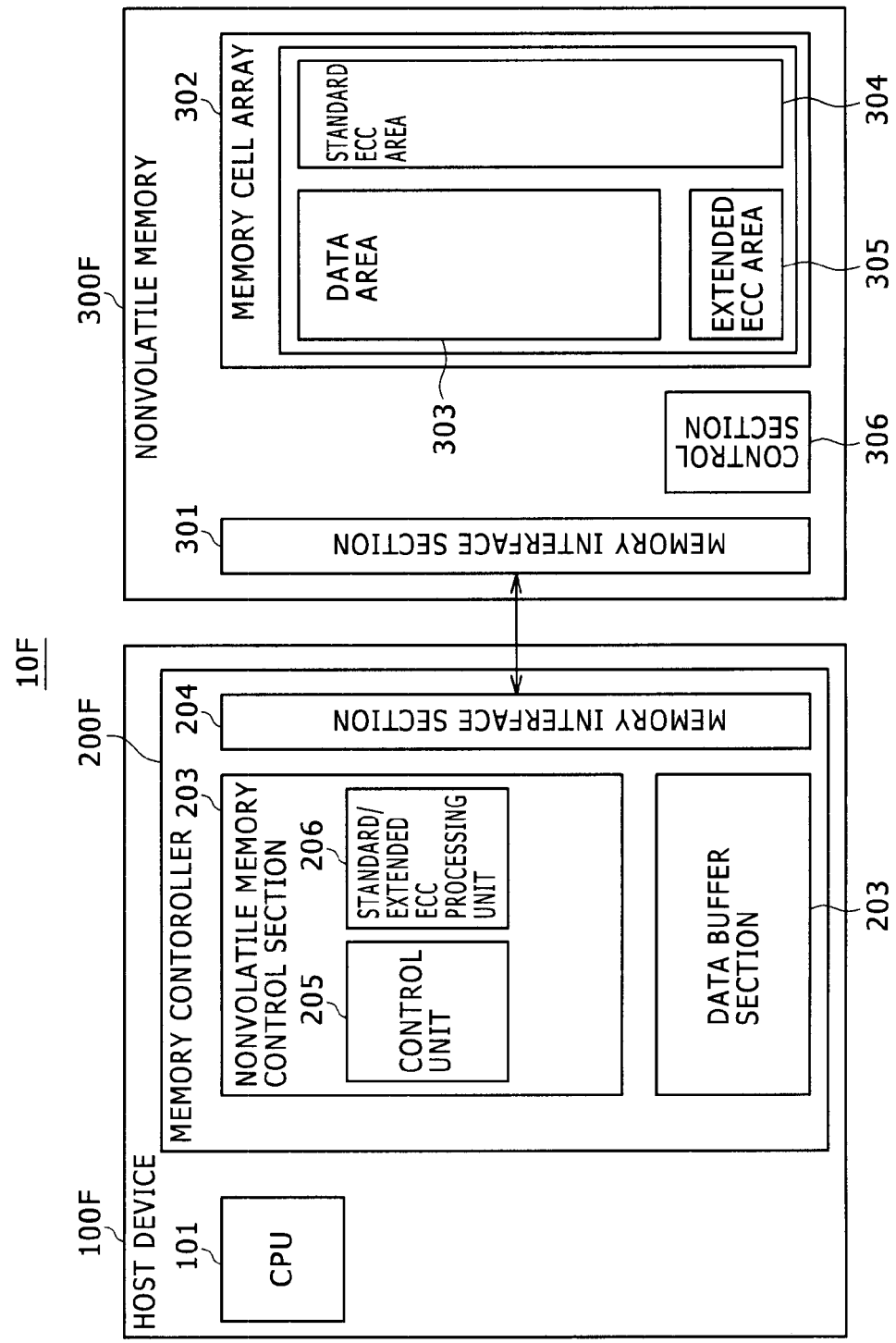
FIG. 22 is a schematic view showing a configuration example of a memory system which constitutes a seventh embodiment of the present invention and which includes a nonvolatile memory apparatus according to the invention.

FIG. 22 is a schematic view showing a configuration example of a memory system 10F which constitutes the seventh embodiment of the present invention and which includes a nonvolatile memory apparatus according to the invention. The memory system 10F of the seventh embodiment differs from the memory system 10 of the first embodiment in the following aspects:

In the memory system 10 of the first embodiment, the host device 100 and the memory controller 200 are structured separately. In the memory system 10F of the seventh embodiment, by contrast, a memory controller 200F is structured to be included in a host device 100F.

Accordingly, the memory system 10F of the seventh embodiment has no need for the host interface section 102 or 201. The other components and their functions of the seventh embodiment are the same as those of the first embodiment.

The present application contains subject matter related to that disclosed in Japanese Priority Patent Applications JP 2009-210433 and 2010-171690 filed in the Japan Patent Office on Sep. 11, 2009 and Jul. 30, 2010 respectively, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nonvolatile memory apparatus comprising:
   a nonvolatile memory section that includes a data area to store data, a standard error correction code area to store standard error correction codes, and an extended error correction code area to store extended error correction codes;
   a standard error correction code processing section configured to generate a standard error correction code to perform an error correction process on data in said data area per access unit;
   an extended error correction code processing section configured to generate an extended error correction code to perform an error correction process on data in said data area per integral multiple of said access unit; and
   a control section configured to control access to said nonvolatile memory section, and respective processes of said standard error correction code processing section and said extended error correction code processing section,
   wherein said control section provides:
   a standard error correction code area write function that, upon receipt of a write instruction, causes said standard error correction code processing section to generate a standard error correction code per access unit from received data, write the data to said data area of said nonvolatile memory section, and write the generated standard error correction codes to said standard error correction code area,
   a read function to, upon receipt of a read instruction, read data from said data area of said nonvolatile memory section, read the standard error correction codes from said standard error correction code area, cause said standard error correction code processing section to perform error detection and correction of the read data per access unit, and output the corrected data,
   an extended error correction code area write function to read data composed of an integer multiple of said access unit starting from an instruction-designated address in said data area of said nonvolatile memory section, and cause said extended error correction code processing section to generate an extended error correction code to write the generated extended error correction code to said extended error correction code area, the extended error correction code being added to one of the standard error correction codes prior to being written to said extended error correction code area, and a function to read data composed of the integer multiple of said access unit starting from the instruction-designated address in said data area of said nonvolatile memory section, read the extended error correction code from said extended error correction code area, cause said extended error correction code processing section to perform error detection and correction of the read data, and output the corrected data.

2. The nonvolatile memory apparatus according to claim 1, wherein, upon receipt of an external instruction, said control section deletes the extended error correction code held in said extended error correction code area of said nonvolatile memory section.

3. The nonvolatile memory apparatus according to claim 1, wherein, upon receipt of an external instruction, said control section causes said extended error correction code processing section to generate the extended error correction code when writing data composed of the integer multiple of said access unit to the instruction-designated address in said data area of said nonvolatile memory section, and writes the generated extended error correction code to said extended error correction code area.

4. The nonvolatile memory apparatus according to claim 1, wherein said control section writes at a same time said extended error correction code to said extended error correction code area and standard error correction code generated from said extended error correction code to said standard error correction code area.

5. The nonvolatile memory apparatus according to claim 1, wherein, upon receipt of an external instruction, said control section reads data composed of the integer multiple of said access unit starting from the instruction-designated address in said data area of said nonvolatile memory section, reads the extended error correction code from said extended error correction code area, causes said extended error correction code processing section to perform error detection and correction of the read data, and writes the corrected data to said data area of said nonvolatile memory section.

6. The nonvolatile memory apparatus according to claim 1, wherein, if any value held in said extended error correction code area is found to match a predetermined fixed value, said control section determines that an area where said value is retained is not used.

7. The nonvolatile memory apparatus according to claim 6, wherein said predetermined fixed value is based on a flag indicating that specific bits in a storage area are not used.

8. A memory controller comprising:
a control section configured to control access to a nonvolatile memory section that includes a data area to store data, a standard error correction code area to store standard error correction codes, and an extended error correction code area to store extended error correction codes;
a standard error correction code processing section configured to generate a standard error correction code to perform an error correction process on data in said data area per access unit; and
an extended error correction code processing section configured to generate an extended error correction code to perform an error correction process on data in said data area per integral multiple of said access unit,
wherein said control section provides:
a standard error correction code area write function that, upon receipt of a write instruction, causes said standard error correction code processing section to generate a standard error correction code per access unit from received data, write the data to said data area of said nonvolatile memory section, and write the generated standard error correction codes to said standard error correction code area,
a function to, upon receipt of a read instruction, read data from said data area of said nonvolatile memory section, read the standard error correction codes from said standard error correction code area, cause said standard error correction code processing section to perform error detection and correction of the read data per access unit, and output the corrected data,
an extended error correction code area write function to read data composed of an integer multiple of said access unit starting from an instruction-designated address in said data area of said nonvolatile memory section, and cause said extended error correction code processing section to generate an extended error correction code to write the generated extended error correction code to said extended error correction code area, the extended error correction code being added to one of the standard error correction codes prior to being written to said extended error correction code area, and
a function to read data composed of the integer multiple of said access unit starting from the instruction-designated address in said data area of said nonvolatile memory section, read the extended error correction code from said extended error correction code area, cause said extended error correction code processing section to perform error detection and correction of the read data, and output the corrected data.

9. The memory controller according to claim 8, wherein said control section writes at a same time said extended error correction code to said extended error correction code area and one of the standard error correction codes generated from said extended error correction code to said standard error correction code area.

10. A memory controller comprising:
a control section configured to control access to a nonvolatile memory section that includes a data area to store data, a standard error correction code area to store standard error correction codes, an extended error correction code area to store extended error correction codes:
a standard error correction code processing section to generate a standard error correction code to perform an error correction process on data in said data area per access unit; and
an extended error correction code processing section configured to generate an extended error correction code to perform an error correction process on data in said data area per integral multiple of said access unit,
wherein said control section provides:
a data area write function to, upon receipt of a write instruction, write received data to said data area of said nonvolatile memory section,
a function to, upon receipt of a read instruction, read from said data area of said nonvolatile memory section the data corrected by the standard error correction code and output the read data, an extended error correction code area write function to read data composed of an integer multiple of said access unit starting from an instruction-designated address in said data area of said nonvolatile memory section, and cause said extended error correction code processing section to generate an extended error correction code to write the generated extended error correction code to said extended error correction code area, the extended error correction code being added to one of the standard error correction codes prior to being written to said extended error correction code area, and a function to read data composed of the integer multiple of said access unit starting from the instruction-designated address in said data area of said nonvolatile memory section, read the extended error correction code from said extended error correction code area, cause said extended error correction code processing section to perform error detection and correction of the read data, and output the corrected data.

11. A memory system comprising:

a nonvolatile memory section that includes a data area to store data, a standard error correction code area to store standard error correction codes, and an extended error correction code area to store extended error correction codes;

a standard error correction code processing section configured to generate a standard error correction code to perform an error correction process on data in said data area per access unit;

an extended error correction code processing section configured to generate an extended error correction code to perform an error correction process on data per integral multiple of said access unit;

a memory controller configured to control access to said nonvolatile memory section and respective processes of said standard error correction code processing section and said extended error correction code processing section; and a host device configured to issue a write instruction and a read instruction to said memory controller, wherein said memory controller provides:

a standard error correction code area write function that, upon receipt of said write instruction from said host device, causes said standard error correction code processing section to generate a standard error correction code per access unit from received data, write the data to said data area of said nonvolatile memory section, and write the generated standard error correction codes to said standard error correction code area, a read function to, upon receipt of said read instruction from said host device, read data from said data area of said nonvolatile memory section, read the standard error correction codes from said standard error correction code area, cause said standard error correction code processing section to perform error detection and correction of the read data per access unit, and output the corrected data, an extended error correction code area write function to, upon receipt of a first instruction from said host device, read data composed of an integer multiple of said access unit starting from an instruction-designated address in said data area of said nonvolatile memory section, and cause said extended error correction code processing section to generate an extended error correction code to write the generated extended error correction code to said extended error correction code area, the extended error correction code being added to one of the standard error correction codes prior to being written to said extended error correction code area, and a function to, upon receipt of a second instruction from said host device, read data composed of the integer multiple of said access unit starting from the instruction-designated address in said data area of said nonvolatile memory section, read the extended error correction code from said extended error correction code area, cause said extended error correction code processing section to perform error detection and correction of the read data, and output the corrected data.

12. The memory system according to claim 11, wherein said host device provides:

a function to designate an address of the data to which to add an extended error correction code for said memory controller; and a function to designate an address of the data from which to delete an extended error correction code for said memory controller, wherein said memory controller controls addition and deletion of the extended error correction codes as designated by said host device.

13. The memory system according to claim 11, wherein said host device designates said memory controller to add an extended error correction code to data required to be protected for prolonged storage, said data being found from among the data stored in said data area of said nonvolatile memory section, and upon receipt of the first instruction from said host device, said memory controller reads data composed of the integer multiple of said access unit starting from the instruction-designated address in said data area of said nonvolatile memory section, and causes said extended error correction code processing section to generate the extended error correction code to write the generated extended error correction code to said extended error correction code area.

14. The memory system according to claim 11, wherein, upon reading data to which the extended error correction code is set, said memory controller verifies and corrects the data in units of said access unit using said standard error correction codes; and in the case of a data error being uncorrectable by said standard error correction codes, said memory controller performs error detection and correction of the data error using said extended error correction code.

15. The memory system according to claim 11, wherein, in the case of corrections performed using standard and extended error correction codes, said host device instructs said memory controller to update original data with corrected data; and upon receipt of an instruction from said host device, said memory controller controls the update of said original data with said corrected data.

16. The memory system according to claim 11, wherein, if any value held in said extended error correction code area is found to match a predetermined fixed value, said memory controller determines that an area where said value is retained is not used.

17. The memory system according to claim 16, wherein said predetermined fixed value is based on a flag indicating that specific bits in a storage area are not used.

18. The memory system according to claim 11, wherein said standard error correction code processing section and said extended error correction code processing section are disposed in one of said memory controller, said nonvolatile memory section, and said host device.

19. The memory system according to claim 11, wherein said host device provides the functions of said memory controller.

* * * * *